United States Patent [19]

Nomura et al.

[11] Patent Number: 5,057,689

[45] Date of Patent: Oct. 15, 1991

[54] SCANNING ELECTRON MICROSCOPE AND A METHOD OF DISPLAYING CROSS SECTIONAL PROFILES USING THE SAME

[75] Inventors: Noboru Nomura, Kyoto; Hideo Nakagawa, Moriguchi; Taichi Koizumi, Osaka; Kenji Harafuji, Moriguchi; Mitsuhiro Okuni; Norimichi Anazawa, both of Higashiosaka, all of Japan

[73] Assignee: Matsushita Electric Industrial Co., Ltd., Osaka, Japan

[21] Appl. No.: 583,541

[22] Filed: Sep. 17, 1990

[30] Foreign Application Priority Data

| Sep. 20, 1989 | [JP] | Japan | 1-244392 |
| Jul. 9, 1990 | [JP] | Japan | 2-181891 |
| Jul. 9, 1990 | [JP] | Japan | 2-181892 |
| Jul. 9, 1990 | [JP] | Japan | 2-181893 |

[51] Int. Cl.$^5$ ............................................. H01J 37/28
[52] U.S. Cl. ............................. 250/310; 250/396 ML; 250/442.1
[58] Field of Search ........... 250/310, 396 R, 396 ML, 250/397, 442.1

[56] References Cited

U.S. PATENT DOCUMENTS

| 4,380,703 | 4/1983 | Schmitt | 250/396 ML |
| 4,393,309 | 7/1983 | Norioka | 250/310 |
| 4,567,369 | 1/1986 | Smith | 250/310 |
| 4,804,840 | 2/1989 | Ichihashi | 250/310 |
| 4,866,280 | 9/1989 | Ohtaka | 250/396 ML |
| 4,928,010 | 5/1990 | Saito et al. | 250/396 ML |

*Primary Examiner*—Bruce C. Anderson
*Attorney, Agent, or Firm*—Panitch, Schwarze, Jacobs & Nadel

[57] ABSTRACT

A scanning electron microscope is disclosed in which an objective lens includes a first pole piece and a second pole piece. The first pole piece is provided with a hole through which an electron beam passes, and is disposed between an electron gun for emitting the electron beam and the second pole piece. The second pole piece has a planar portion on which a specimen is placed, and the second pole piece being mounted on a supporting block movable in a plane substantially perpendicular to the projecting direction of the electron beam.

10 Claims, 17 Drawing Sheets $Bz'0 = Bz8 = Bz9, Bz6 > Bz7$ $Bz'0 = Bz6 = Bz7 = Bz8 = Bz9$

SCANNING ELECTRON MICROSCOPE AND A METHOD OF DISPLAYING CROSS SECTIONAL PROFILES USING THE SAME

BACKGROUND OF THE INVENTION

1. Field of the Invention

The present invention relates to a scanning electron microscope, and more particularly to a scanning electron microscope suitable for observing the inside of recessed portions of very small uneven patterns formed in a relatively large specimen. Furthermore, the invention relates to a method of displaying cross sectional profiles of uneven patterns formed in the surface of a specimen using the scanning electron microscope.

2. Description of the Prior Art

In recent years, in the field of semiconductor integrated circuits, the size of semiconductor substrates has been increasing, while the size of circuit elements integrated on the substrates has been decreasing. In fact, the size of the circuit elements has been reduced to as small as less than one micron (to the submicron size).

In the manufacture of such semiconductor integrated circuits, it is necessary to frequently inspect very small patterns being formed on semiconductor substrates during various manufacturing processes, such as lithography process and etching process, or after completion of the manufacture. A scanning electron microscope (hereinafter abbreviated as SEM) is an essential instrument to inspect such very small patterns.

An SEM comprises an electron gun for emitting an electron beam, an objective lens for creating a magnetic field in the passage through which the electron beam passes, and a secondary electron detector for detecting secondary electrons generated by the impingement of the electron beam on a specimen, the object to be observed.

FIG. 17B shows a cross section of an objective lens of a prior art SEM. The objective lens has a symmetrical configuration with respect to its axis. For clarity, the axis of symmetry is hereinafter referred to as the axis or the Z-axis, the direction parallel to the axis of symmetry as the axial direction, and the direction perpendicular thereto as the lateral direction.

The objective lens has a ring-shaped coil 54 for creating a magnetic field and a magnetic path 41 for guiding the lines of force of the magnetic field created around the coil 54. The magnetic path 41 has an upper pole piece 41a and a lower pole piece 41b. The upper pole piece 41a includes an axially symmetrical cone-shaped portion the bottom of which is provided with a hole through which an electron beam 43 passes. The lower pole piece 41b is a planar plate symmetrical with respect to the axis, the center of which is provided with a hole through which the electron beam 43 passes. A lens field 55 is formed between the hole in the upper pole piece 41a and the hole in the lower pole piece 41b.

In FIG. 17B, the magnetic field strength in the axial direction is indicated by $|Bz|$. The magnetic field strength in the axial direction varies in the direction of the axis (Z-axis), reaching the maximum between the upper pole piece 41a and the lower pole piece 41b.

After passing through the hole in the upper pole piece 41a, the electron beam 43 is focused by the lens field 55, passes through the hole in the lower pole piece 41b, and impinges on a specimen 42, the object to be observed. The impingement of the beam of electrons (primary electrons) on the specimen 42 causes secondary electrons to be emitted from the surface of the specimen 42. The secondary electrons are detected by a secondary electron detector (not shown) disposed above the upper pole piece 41a. Since an electric field acting in the axial direction is formed in the space between the specimen 42 and the secondary electron detector, a Lorentz force acts upon the secondary electrons because of this electric field and the magnetic field created by the objective lens, causing the secondary electrons to move spirally to impinge on the secondary electron detector.

To increase the signal-to-noise ratio of an image (SEM image) produced by the SEM and obtain a highly resolved, sharply focused image, it is essential to increase the ratio of the number of secondary electrons detected by the secondary electron detector to that of secondary electrons emitted from the specimen (the collection ratio). For this purpose, the specimen should be placed at a position where a high axial magnetic field strength is experienced.

In the SEM of FIG. 17B, one possible method for increasing the collection ratio of the secondary electrons is to place the object as close as possible to a position between the upper pole piece 41a and the lower pole piece 41b where the axial magnetic field strength is the highest. However, this method is not suitable for observing a specimen larger than the hole in the lower pole piece 41b because the lower pole piece 41b interferes. Usually, a semiconductor wafer has a diameter of more than a few inches and cannot be directly placed sufficiently close to the position where the axial magnetic field strength is the highest.

Another possible method for increasing the collection ratio of the secondary electrons is to insert the specimen 42 in a position between the upper pole piece 41a and the lower pole piece 41b where the axial magnetic field strength is the highest. However, with this method, it is only possible to observe a specimen small enough to be inserted between the upper pole piece 41a and the lower pole piece 41b. A wafer having a diameter of more than a few inches cannot be observed by this method unless the wafer is sliced into pieces small enough to be inserted between the upper pole piece 41a and the lower pole piece 41b.

Once sliced into smaller pieces, the wafer can no longer be used in the subsequent manufacturing process and must be scrapped after it is inspected using the SEM. Generally, in a clean room where semiconductor integrated circuits are manufactured, it is forbidden to slice wafers, or to bring sliced wafer pieces from the outside because the cleanness of the clean room must be maintained. This means that when the SEM is installed in a clean room, sliced wafer pieces cannot be observed using the SEM. Therefore, an SEM capable of observing a large wafer without slicing it into smaller pieces is much in need in the field of semiconductor circuit manufacture.

FIG. 17C shows a cross section of an objective lens of another prior art SEM. This objective lens has a construction that allows a relatively large specimen 42 to be inserted between the upper pole piece 41a and the lower pole piece 41b.

However, this SEM has the disadvantage that the axial magnetic field strength decreases because of an increased distance between the upper pole piece 41a and the lower pole piece 41b. Also, since the specimen 42 must be moved to a great degree in the lateral direction in order to observe a desired portion thereof, the lower pole piece 41b is required to have an area a few times greater than that of the specimen 42 to be observed. However, it is virtually not possible to put in practical use an objective lens having such a large lower pole piece 41b.

Still another prior art SEM developed with the aim of increasing the collection ratio of secondary electrons is reported in "The Japan Society of Applied Physics, 1988, Spring". This SEM accomplishes an increased axial magnetic field strength by providing an auxiliary coil in addition to the coil 44 of the conventional objective lens. However, this SEM has the disadvantage of an increased size and big power consumption.

Thus, the prior art SEMs have the disadvantage that it is virtually not possible to provide a strong axial magnetic field for observing a relatively large specimen without cutting it into smaller pieces. Therefore, the problem is that the secondary electrons cannot be detected with a high collection ratio, making it difficult to obtain a highly resolved image with a high signal-to-noise ratio from a large specimen.

In particular, the disadvantage in the prior art SEMs is a low collection ratio of the secondary electrons emitted from recessed portions of uneven patterns formed in a specimen. This causes a problem, for example, that it is difficult to obtain a clear SEM image from the bottom of a submicron contact hole of a semiconductor integrated circuit. This is because under a relatively weak axial magnetic field the secondary electrons emitted from the bottom of the contact hole can easily hit the side walls of the contact hole and are mostly prevented from reaching the secondary electron detector.

FIG. 18 is a schematic diagram illustrating the motion of secondary electrons emitted from the bottom of a contact hole. The cyclotron radius (Larmor radius) of the spiralling motion of a secondary electron varies inversely with the magnetic field strength B applied in the axial direction. Therefore, the smaller the magnetic field strength B in the axial direction, the larger the cyclotron radius becomes, thus increasing the possibility of the secondary electron hitting the side walls of the contact hole while decreasing the possibility (collection ratio) of the secondary electron reaching the secondary electron detector.

The above relationship, said of the contact hole, between the axial magnetic field B and the collection ratio of secondary electrons is also applicable to uneven patterns having a high aspect ratio other than contact holes.

Also, the prior art SEMs are characterized by a long focal length and a great depth of focus. This means that when the surface of a specimen is scanned by the electron beam, it is difficult to obtain information about the uneven patterns formed in the surface of the specimen. Therefore, to obtain a cross sectional profile of uneven patterns in the surface of the specimen, it is required to cut the specimen and scan the cross sectional face with the electron beam. However, for the previously mention reason, cutting the specimen wafer must be avoided in the manufacturing process of semiconductor integrated circuits.

SUMMARY OF THE INVENTION

According to the invention, a scanning electron microscope is provided, which overcomes the above-discussed and numerous other disadvantages and deficiencies of the prior art, the scanning electron microscope comprising: an electron gun for emitting an electron beam; an objective lens for forming a magnetic field in a path through which the electron beam passes; and a secondary electron detector for detecting secondary electrons produced by the impingement of the electron beam on a specimen, wherein: said objective lens includes a first pole piece and a second pole piece; said first pole piece is provided with a hole through which the electron beam passes, and is disposed between said electron gun and said second pole piece; and said second pole piece has a planar portion on which the specimen is placed, and said second pole piece being mounted on a supporting block movable in a plane substantially perpendicular to the projecting direction of the electron beam.

In a preferred embodiment, the second pole piece is formed from a plate of a material having high magnetic permeability, and said supporting block is formed from a non-magnetic material.

In a preferred embodiment, the second pole piece consists of a multi-film layer comprising a high-magnetic-permeability film and a non-magnetic film, and said supporting block is formed from a nonmagnetic substance.

In a preferred embodiment, the scanning electron microscope comprises astigmatism correction means for correcting astigmatism of the objective lens by adjusting magnetic field formed in the electron beam path according to an electric amount supplied to said astigmatism correction means, memory means for storing values of the electric amount to the astigmatism correction means when astigmatism corrections at a plurality of selected positions of said specimen are achieved in an initial adjustment mode, said values of the electric amount corresponding respectively to the positions of the specimen at which said astigmatism corrections are achieved, and control means for controlling the electric amount to be supplied to the astigmatism correction means to be equal to the value of the electric amount which is read out from said memory means according to a position of the specimen to be observed in an observation mode.

In a preferred embodiment, the scanning electron microscope comprises astigmatism correction means for correcting astigmatism of the objective lens by adjusting magnetic field formed in the electron beam path according to an electric amount supplied to said astigmatism correction means, magnetic field sensor means for measuring a strength of a magnetic field formed between said first pole piece and said second pole piece, memory means for storing values of the electric amount to be supplied to the astigmatism correction means and magnetic field strengths measured by said magnetic field sensor means when astigmatism corrections at a plurality of selected positions of said specimen are achieved in an initial adjustment mode, said values of the electric amount and the magnetic field strengths corresponding respectively to the positions of the specimen at which the astigmatism corrections are achieved, and control means for controlling the electric amount to be supplied to the astigmatism correction means to be equal to the value of the electric amount which is read out from said memory means according to a position of the specimen to be observed in an observation mode, said control means comparing a magnetic field strength measured by the magnetic filed sensor means at said position of the specimen to be observed with the magnetic field strength which is read out from said memory means according to said position of the specimen to be observed, said control means controlling the electric amount to be supplied to the astigmatism correction means so as to reduce a difference between said magnetic field strength measured by the magnetic field sensor means and said magnetic field strength which is read out from said memory means.

In a preferred embodiment, the scanning electron microscope comprises astigmatism correction means for correcting astigmatism of the objective lens by adjusting magnetic field formed in the electron beam path according to an electric amount supplied to said astigmatism correction means, magnetic field sensor means for measuring a strength of a magnetic field formed between said first pole piece and said second pole piece, memory means for storing magnetic field strengths measured by said magnetic field sensor means when astigmatism corrections at a plurality of selected positions of said specimen are achieved in an initial adjustment mode, and storing an expression defining the relationship between said measured magnetic field strengths and the positions of the specimen at which said magnetic field strengths are obtained, control means for controlling a magnetic field strength measured by said magnetic filed sensor means to be equal to the magnetic filed strength which is obtained from said expressions stored in said memory means according to a position of the specimen to be observed in an observation mode.

In a preferred embodiment, the astigmatism correction means comprises astigmatism correction coils for reducing astigmatism of the objective lens by adjusting the magnetic field formed in the electron beam path according to a current to be supplied, and height control means for adjusting the height of the said supporting block according to a voltage to be supplied.

According to the invention, a method of displaying cross sectional profiles is provided, comprising the steps of: obtaining a plurality of secondary electron signals by scanning a surface of a specimen by electron beams while incrementally varying a focal length of the electron beams by changing a current flowing through an objective lens coil; storing said secondary electron signals in relation to respective values of varied focal lengths; and producing a cross sectional profile of the surface of the specimen on the basis of the values of the incrementally varied focal length and the positions on a surface of the specimen at which the electron beams with focal lengths corresponding respectively to said values is focused.

Thus, the invention described herein makes possible the objectives of:

(1) providing a scanning electron microscope having a construction that allows a large specimen to be inserted directly, without being cut into smaller pieces, into a position where an objective lens provides the maximum magnetic field strength in its axial direction.
(2) providing a scanning electron microscope capable of obtaining a highly resolved, bright image without greatly enlarging the magnetic path of the objective lens.
(3) providing a scanning electron microscope also capable of obtaining a highly resolved, bright image from the bottom of a contact hole or other uneven pattern formed in a semiconductor wafer.
(4) providing a method of displaying cross sectional profiles whereby cross sectional profiles of uneven patterns formed in the surface of a specimen can be obtained without cutting the specimen.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
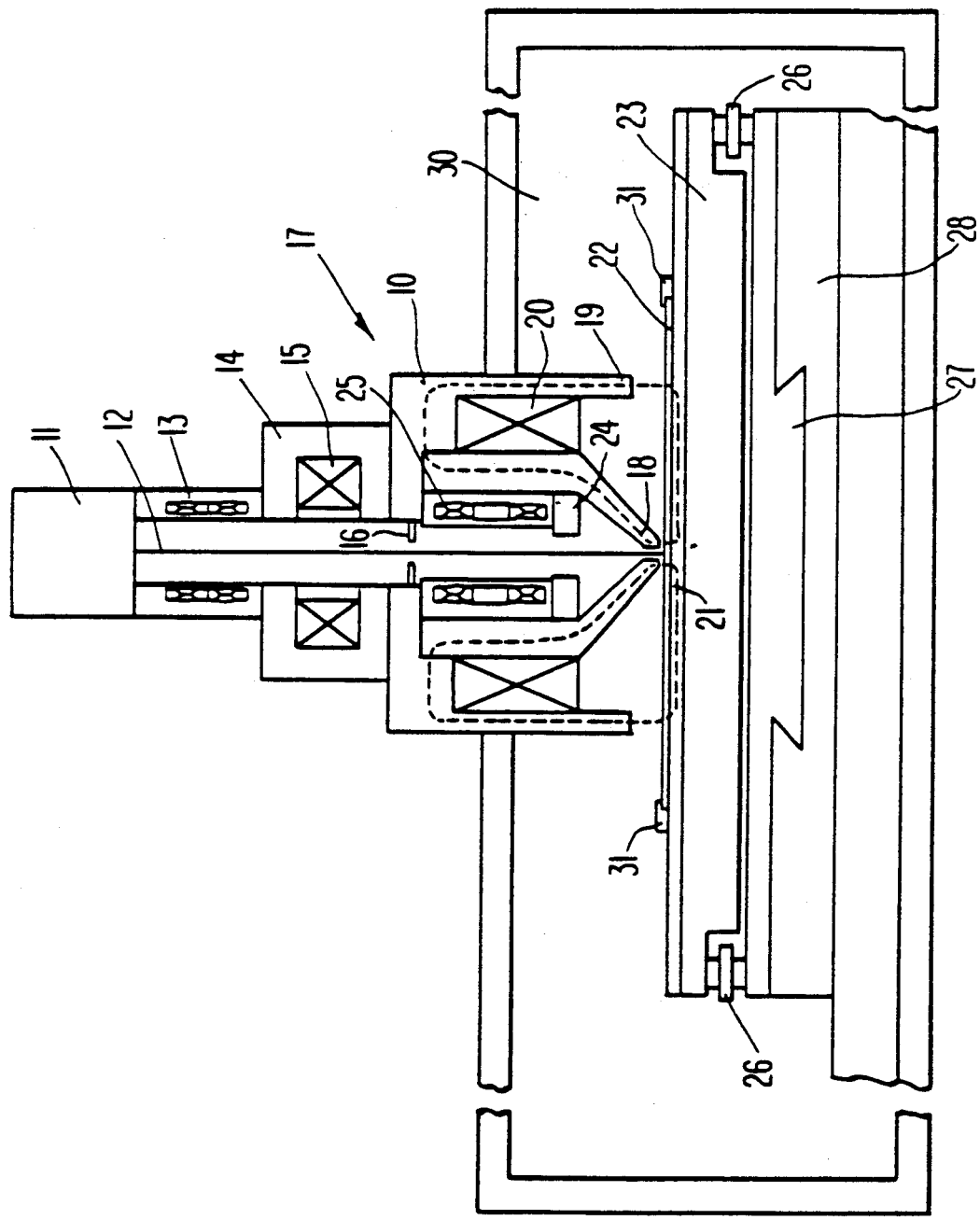
FIG. 1 is a cross sectional view showing in a schematic form the construction of an SEM in a first embodiment of the present invention.

FIG. 1 is a schematic view showing the construction of an SEM in a first embodiment of the present invention. The SEM of this embodiment comprises an electron gun 11 for emitting an electron beam 12, an axis alignment coil 13 for aligning the axis of the electron beam 12 emitted from the electron gun 11, a focusing lens 14 having a focusing coil 15 for focusing the axis-aligned electron beam 12, an aperture 16 for limiting the path of the electron beam 12, a deflection coil 25 for deflecting the electron beam 12 passed through the aperture 16, an objective lens 17 for bringing the focus of the electron beam 12 onto a specimen 22, and a secondary electron detector 24 for detecting secondary electrons emitted from the specimen 22 scanned by the electron beam 12. These components constitute an axially symmetric electron optical system.

The specimen (silicon wafer) 22 to be observed is placed in a specimen chamber 30. The electron beam 12 focused by the objective lens 17 is projected onto the wafer 22, causing secondary electrons to be emitted from the wafer 22. The electron beam 12 is deflected by the deflection coil 25 to scan the surface of the wafer 22 two-dimensionally. The secondary electrons emitted from the wafer 22 are detected by the secondary electron detector 24, these electrons being converted into a secondary electron signal on the basis of which a secondary electron image (SEM image) is produced on a display (CRT) not shown.

A section that serves as the passage of the electron beam 12 and the specimen chamber 30 are maintained in a highly evacuated state by means of an evacuator (not shown).

The objective lens 17 of this embodiment includes a ring-shaped coil 20 and a magnetic path 10 that guides the lines of force of a magnetic field created by the coil 20. The magnetic path 10 includes an upper pole piece 18 (a first pole piece) and a lower pole piece 21 (a second pole piece) which is separated from the upper pole piece 18.

Figure 2:
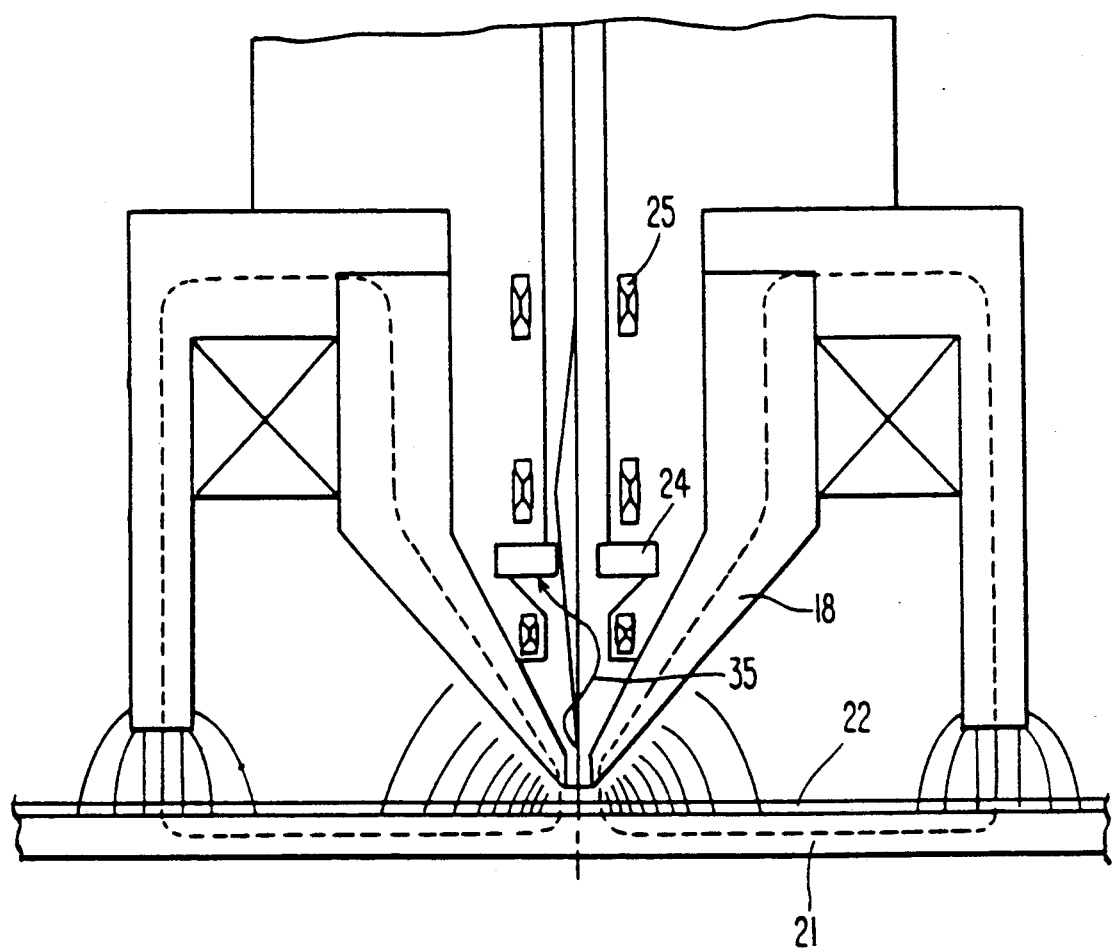
FIG. 2 is a cross sectional view of the objective lens of the first embodiment of the invention.

FIG. 2 is a detailed diagram of the objective lens 17. As shown in FIG. 2, the upper pole piece 18 has an axially symmetrical cone-shaped portion, the bottom thereof being provided with a hole through which the electron beam 12 passes. The lower pole piece 21 has a planar shape and is movable in the direction perpendicular to the axis (in the lateral direction). Both the upper pole piece 18 and the lower pole piece 21 are formed from materials of high magnetic permeability, such as pure iron, cobalt iron, permalloy, etc.

To make the objective lens 17 function as a lens, an electric current is made to flow through the coil 20, thus producing a magnetic field around the coil 20. The lines of forces of the magnetic field are guided by the magnetic path 10 and form a loop as shown by a dotted line in FIG. 2. In this loop-shaped magnetic field, an area between the hole portion of the upper pole piece 18 and the surface of the lower pole piece 21 works as an effective area that functions as a lens for the electron beam 12. In this area, a lens field is formed for focusing the electron beam 12.

Figure 17A:
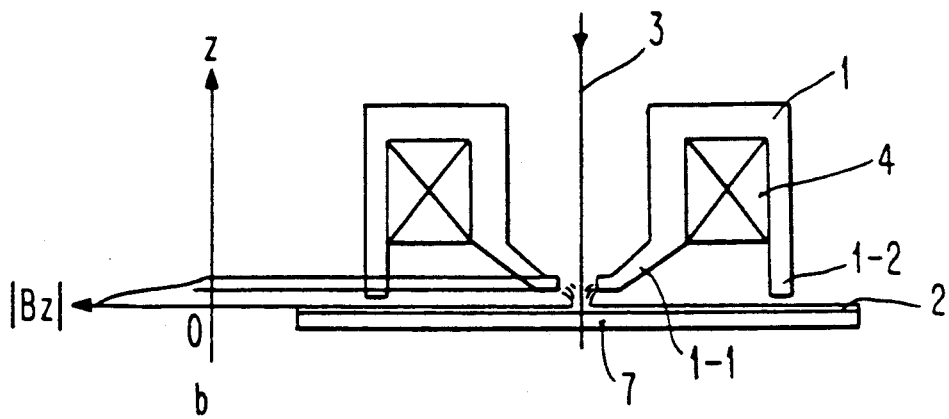
FIGS. 17A, 17B, and 17C are cross sectional views respectively showing the objective lens of the present invention, a prior art objective lens, and another prior art objective lens in comparison with each other.
Figure 17B:
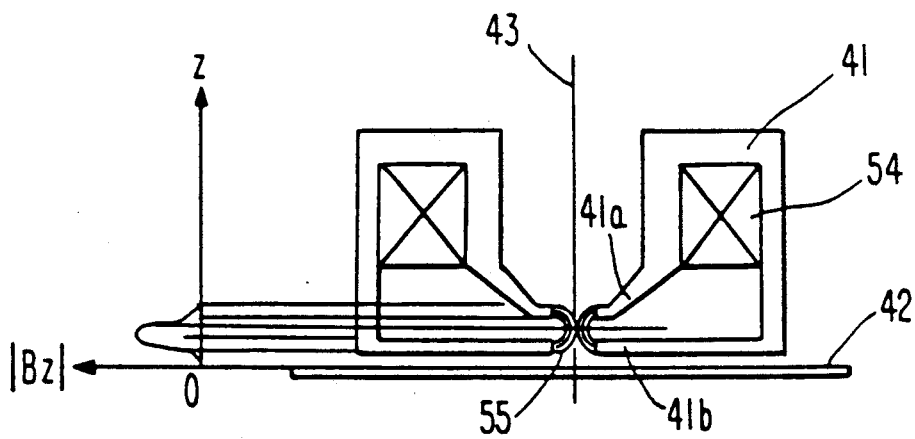
Figure 17C:
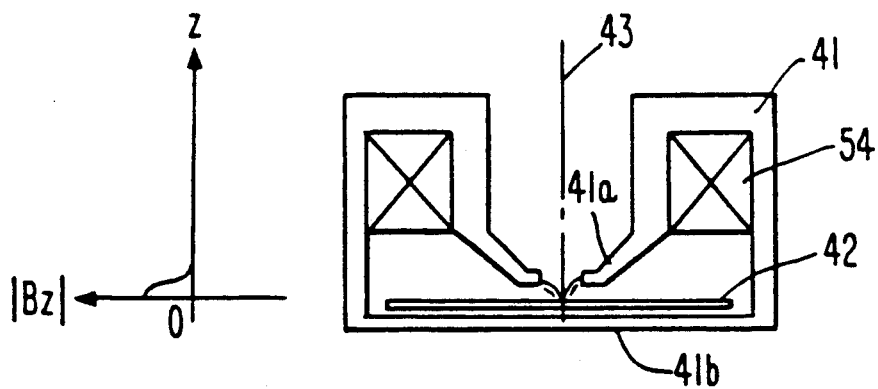
Figure 18:
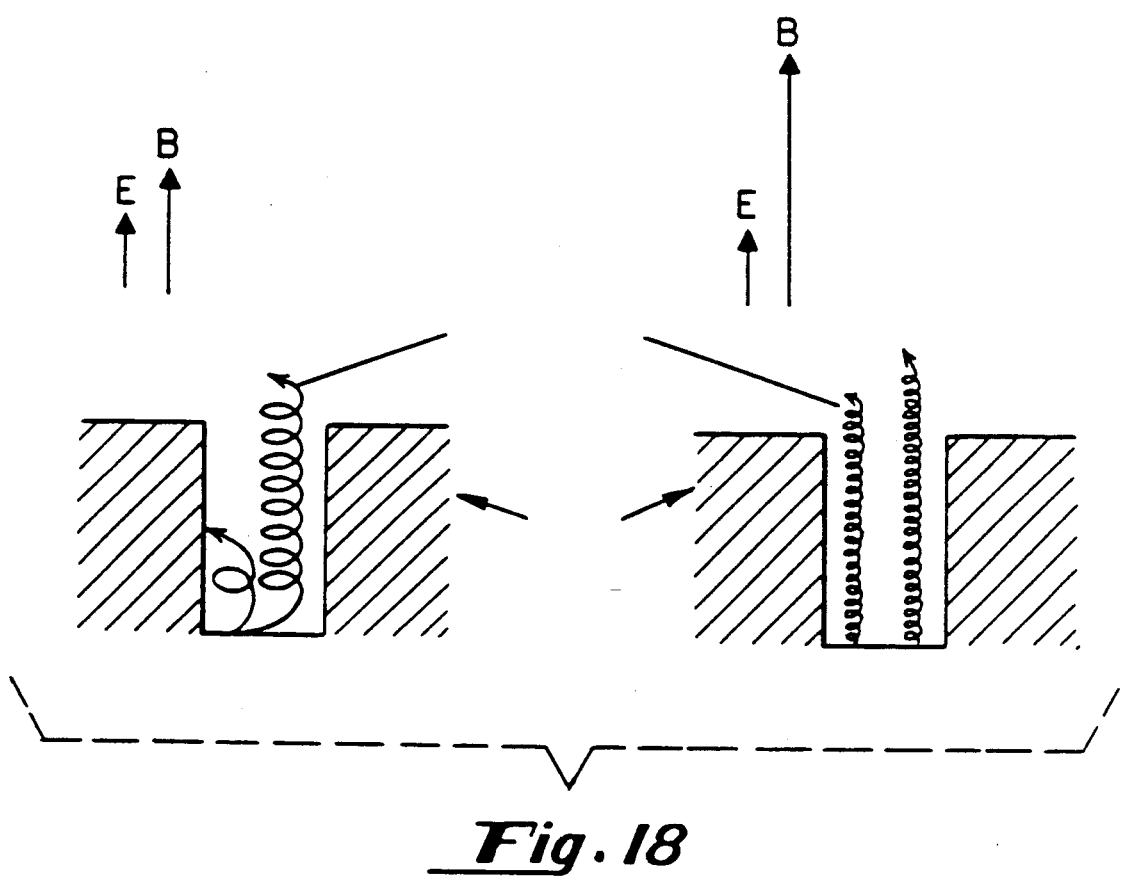
FIG. 18 is a diagrammatic cross sectional view showing the cyclotron motion of a secondary electron emitted from the bottom of a contact hole.

The wafer 22 is placed on the lower pole piece 21. This construction allows a large specimen such as a wafer of 6 inches outer diameter to be placed directly in a position between the upper pole piece 18 and the lower pole piece 21 where the axial magnetic field strength is the highest. The axial magnetic field strength in the SEM of this embodiment is shown by $|B_z|$ in FIG. 17A. According to this embodiment, the axial magnetic field strength is the highest on the wafer 22. At the position where the axial magnetic field strength is the highest, the depth of focus of the objective lens 17 is the smallest and the aberration of the lens is also the smallest.

Referring back to FIG. 1, we will now describe a means for moving the wafer 22. The wafer 22 is mounted directly on the lower pole piece 21 and is fixed thereon using a retainer 31. The lower pole piece 21 is mounted on a supporting block 23 which is mounted on moving blocks 27 and 28. By turning an adjusting screw 26 provided between the supporting block 23 and the moving block 27, the parallelism of the lower pole piece 21 is adjusted with respect to the upper pole piece 18 (i.e. the parallelism of the lower pole piece 21 with respect to a plane perpendicular to the axis). The moving blocks 27 and 28 are movable in a plane perpendicular to the axis. Moving the moving blocks 27 and 28 causes the supporting block 23 mounted thereon, hence the lower pole piece 21 and the wafer 22, to move along the plane perpendicular to the axis.

Figure 3:
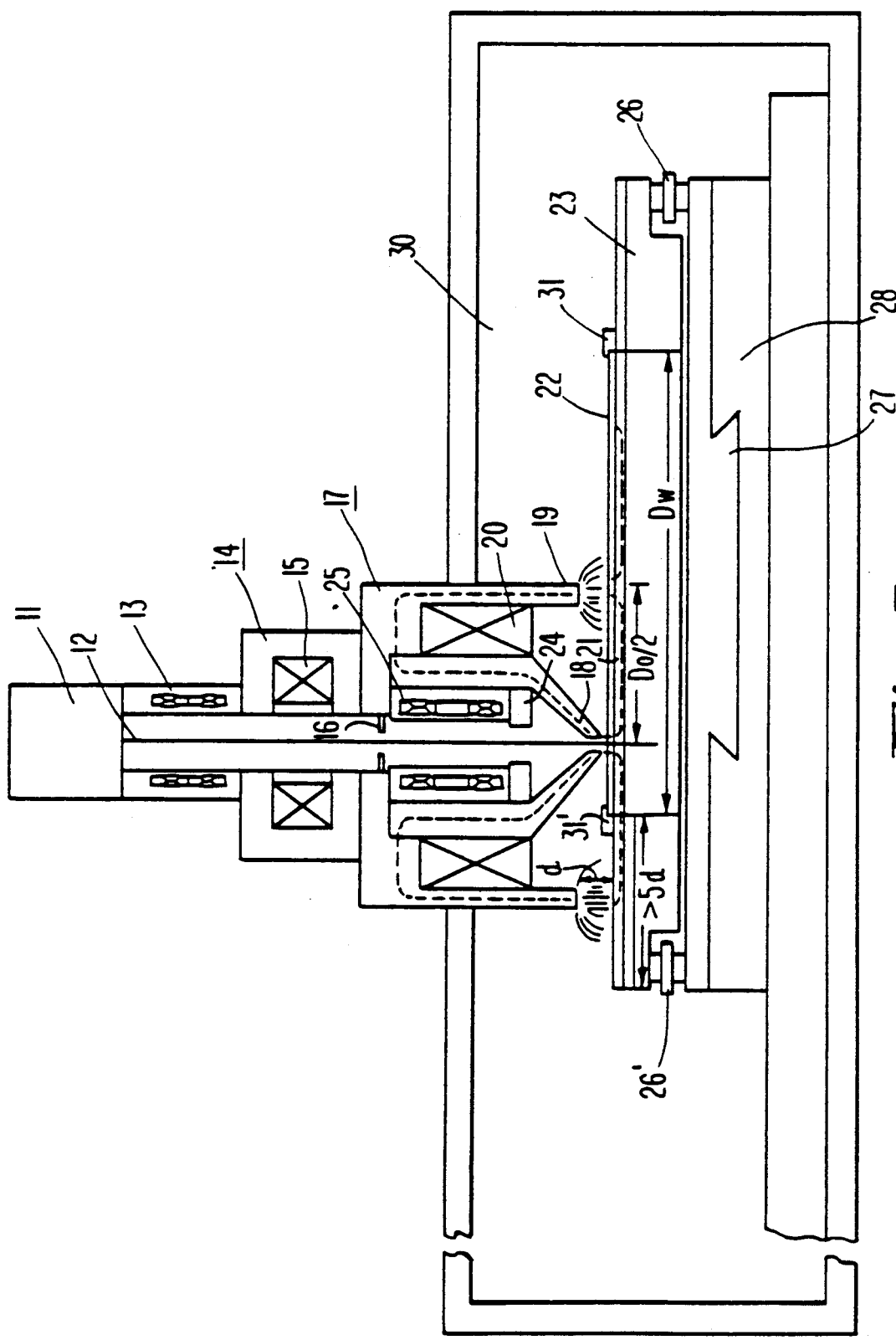
FIG. 3 is a cross sectional view showing in a schematic form the construction of the SEM of the first embodiment when an edge portion of a specimen is being observed.

FIG. 3 shows the positional relationship between the upper pole piece 18 and the lower pole piece 21 when an edge portion of the wafer 22 is being observed. To observe a desired portion on the surface of the wafer 22, the lower pole piece 21 with the wafer 22 mounted thereon must be moved in a lateral direction so that the desired portion is scanned by the electron beam 12. To prevent variations in the magnetic field strength between the hole portion of the upper pole piece 18 and the surface of the lower pole piece 21, the lower pole piece 21 is designed to have a size sufficiently larger than that of the wafer 22. In this embodiment, it is so designed that the lower pole piece 21 has a size longer than that of the wafer 22 by more than five times a distance d between the upper pole piece 18 and the lower pole piece 21.

In a preferred embodiment, when the outer diameter of the wafer 22 is denoted as $D_{WO}$, the distance between the hole portion of the upper pole piece 18 and the surface of the lower pole piece 21 as d, and the outer diameter of the outer lower end 19 of the magnetic path 10 as $D_O$, the outer diameter of the lower pole piece 21 should be greater than $D_{WO}+D_O+10d$. For example, when the outer diameter of the wafer 22 is 6 inches (150 mm), the distance d 6 mm, and the outer diameter $D_O$ 100 mm, the outer diameter of the lower pole piece 21 should be greater than 310 mm.

It is undesirable if the distance between the upper pole piece 18 and the lower pole piece 21 varies when the lower pole piece 21 is moved in the lateral direction. Therefore, a high degree of parallelism must be provided between the upper pole piece 18 and the lower pole piece 21. Such a high degree of parallelism can be achieved by adjusting the adjusting screw 26 provided between the supporting block 23 and the moving blocks 27 and 28, as previously mentioned.

If the parallelism is imperfect, the height of the observation point at the surface of the specimen changes as the lower pole piece 21 is moved in the lateral direction. By adjusting the adjusting screw 26, the changed height of the observation point can also be adjusted. Such adjustments are made manually by observing the secondary electron image on the display or using an optical microscope.

Thus, according to this embodiment, since the upper pole piece 18 is separated from the lower pole piece 21, a large specimen such as the 6-inch wafer 22 can be inserted in a position between these pole pieces where the axial magnetic field strength is the highest, under which to observe the specimen. Therefore, without increasing the size of the objective lens 17, the cyclotron radii of secondary electrons can be reduced substantially to achieve a high collection ratio of the secondary electrons, thereby assuring the production of a bright and highly resolved image.

Therefore, it is also possible to obtain a bright and highly resolved SEM image from the inside of recessed portions of very small uneven patterns in the specimen, for example, from the bottom of a submicronsize contact hole of a semiconductor integrated circuit during the process of manufacture. Furthermore, even if the projection amount of the electron beam 12 is reduced by some degree, an SEM image of a sufficiently good quality can be obtained. Therefore, when observing a material that can be easily charged, the accelerating voltage of the electron beam 12 can be reduced to prevent the material from taking on a charge. This serves to prevent the image quality from suffering due to charging up.

To observe the surface of the wafer 22 during the manufacture of a semiconductor integrated circuit, since a highly resolved SEM image can be obtained without cutting the wafer 22 into smaller pieces, there is no need to cut the wafer 22 for inspection during the process of manufacture. This means that the wafer 22 taken from the manufacturing process for observation by the SEM can be put back into the manufacturing process after completion of the observation. This helps to realize a high throughput in the manufacture of semiconductor integrated circuits, etc.

Figure 19:
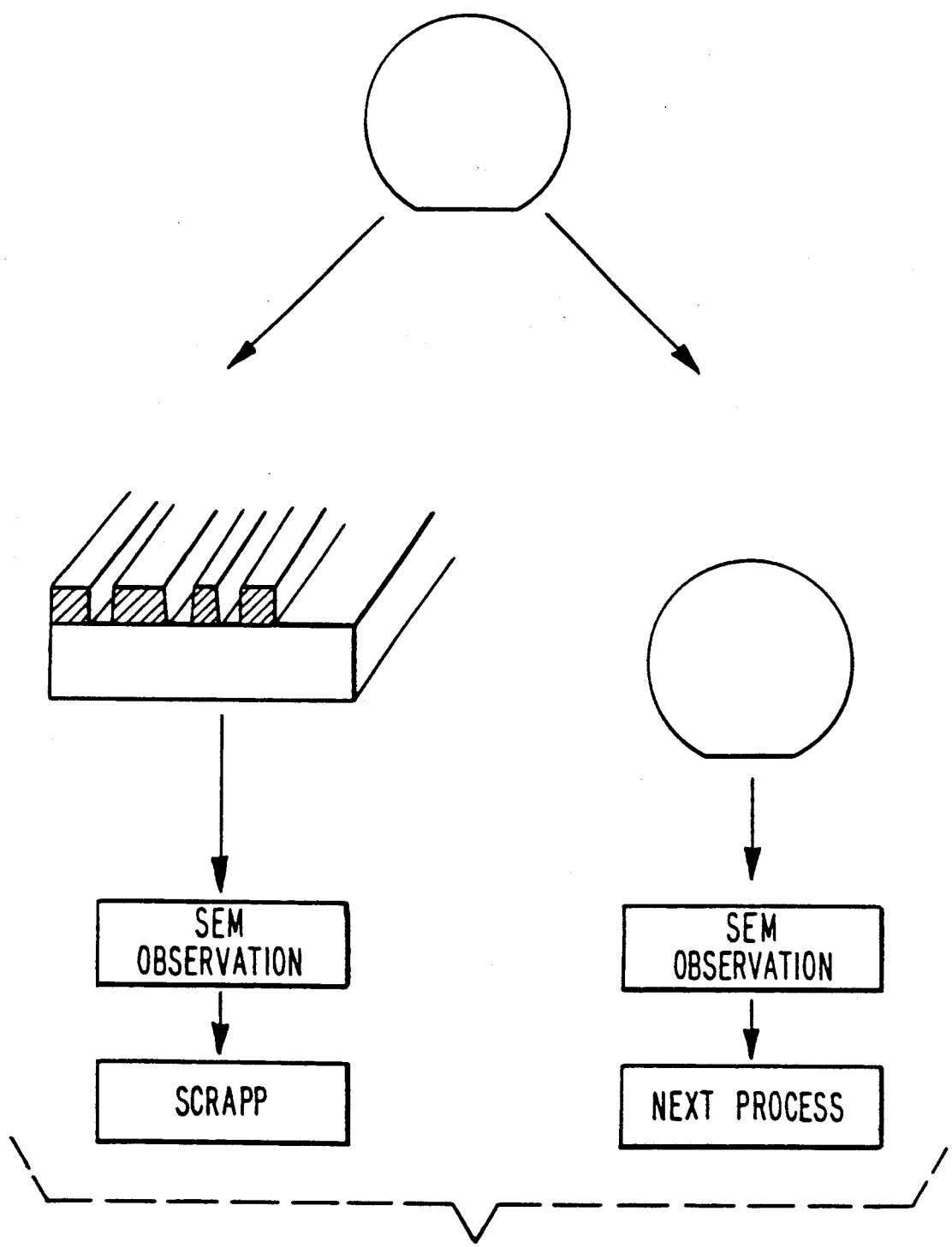
FIG. 19 is a schematic diagram showing how a wafer subjected to inspection by an SEM is handled in the manufacturing process of semiconductor integrated circuits.

FIG. 19 is a schematic diagram showing a sequence for observing a wafer using an SEM in the manufacturing process of semiconductor integrated circuits. With a conventional SEM, the wafer is cut for observation by the SEM, and the wafer specimen is scrapped after completion of the observation. On the other hand, with the SEM of this embodiment, the wafer does not have to be cut but can be used directly as a specimen for observation by the SEM, and after completion of the observation, the wafer can be used in the subsequent manufacturing process.

Also, according to the SEM of this embodiment, since the lower pole piece 21 is a movable planar plate, the specimen directly mounted on the lower pole piece 21 can be moved along with the lower pole piece 21. It is therefore possible to observe a desired portion on the wide surface of a large specimen under a high axial magnetic field although the objective lens 17 is relatively small.

Figure 4:
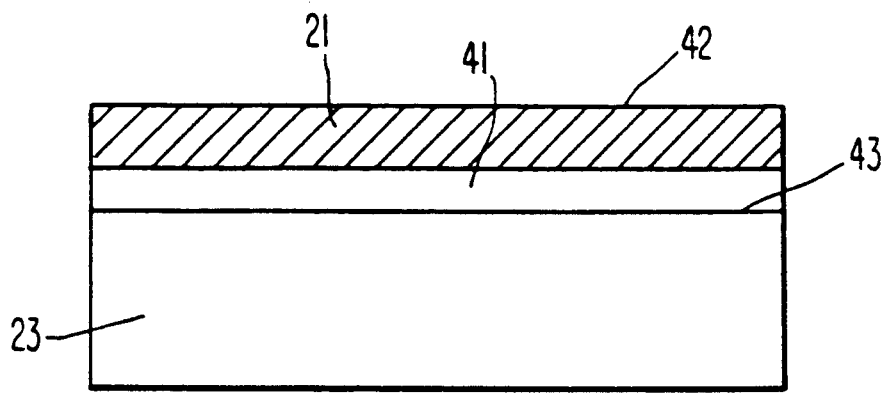
FIG. 4 is a cross sectional view of a lower pole piece of the first embodiment of the invention.

FIG. 4 shows detailed cross sections of the lower pole piece 21 and supporting block 23 of this embodiment. It is desirable that the lower pole piece 21 and the supporting block 23 be of a light weight construction. A heavier construction will take a longer time for acceleration and deceleration when moving the lower pole piece 21 in the lateral direction.

The lower pole piece 21 shown in FIG. 4 is mounted on a polished surface 43 of the supporting block 23 formed from a non-magnetic material, alumina, with an adhesive layer 41 interposed therebetween. The lower pole piece 21 is formed from a material of high magnetic permeability. If the lower pole piece 21 and the supporting block 23 are both formed from relatively heavy materials of high magnetic permeability, such as soft iron (specific gravity: 7.8), permalloy (specific gravity: 8.6), etc., it takes time to move the lower pole piece 21 because of its heavy weight construction, which increases the overall time for the observation. Also, a heavy weight construction tends to cause friction at guide portions of the moving blocks 27 and 28, impairing the accuracy of the positional control of the moving blocks 27 and 28, and producing dust as a result of the friction. It is imperative to prevent production of dust because dust interferes with the observation of very small patterns and reduces yields of the semiconductor integrated circuits.

Since the object to be observed, such as the wafer 22, is placed on the lower pole piece 21, the surface 42 of the lower pole piece 21 is required to have a high degree of flatness like that of a wafer chuck of a stepper device. Generally, it is believed that the surface 42 of the lower pole piece 21 can be provided with a high degree of flatness by grinding or polishing the surface 42 thereof.

However, it is difficult to grind or polish with high accuracy a high-permeability magnetic material which is used as the material of the pole piece, because grinding or polishing leaves a strain in the worked layer of the high-permeability magnetic material, deteriorating its magnetic properties. To recover the magnetic properties, the high-permeability magnetic material must be annealed, but annealing will produce curvature of the worked surface thereof (finished surface). It is thus difficult to precisely work the surface of soft iron, permalloy, sendust, etc.

The requirements (lightness and flatness) for the lower pole piece 21 are satisfied according to the construction of this embodiment. The lower pole piece 21 of this embodiment, which is formed from a thin plate (thickness: 300 $\mu$m composed of relatively heavy magnetic material of high permeability, is mounted on the supporting block 23 (thickness: 3 mm composed of a relatively light non-magnetic material, alumina (specific gravity: 4.1), thus attaining a practical and effective reduction in the total weight of the construction. The combined weight of the lower pole piece 21 and supporting block 23 of this embodiment is about half the weight of a lower pole piece formed from one thick block of a high-permeability magnetic material (specific gravity: 5 to 8.6).

To reduce the thickness of the lower pole piece, for example, to step it down to about 0.3 mm, materials having high saturation magnetic flux density should be used as materials for the lower pole piece 21, such materials including, for example, permalloy (specific gravity: 8.4, saturation magnetic flux density: 8000 Gaus), amorphous magnetic alloy (specific gravity: about 7, saturation magnetic flux density: 6000–9000 Gaus), ferrite with high magnetic permeability (specific gravity: about 5, saturation magnetic flux density: 4000–6000 Gaus), etc.

The supporting block 23 of this embodiment is formed from a material having good workability. Since the lower pole piece 21 is mounted on the polished surface 43 of the supporting block 23 having good workability with the adhesive layer interposed therebetween, the lower pole piece formed from a magnetic material of high permeability does not necessarily have to be polished. Therefore, its magnetic properties do not deteriorate.

The following describes briefly a process for the manufacture of the lower pole piece 21. First, the top surface of the supporting block 23 is polished by means of abrasion, and then the adhesive layer 41 is formed on the surface of the polished surface 43. Thereafter, the lower pole piece, a thin magnetic plate, is glued onto the supporting block 23 via the adhesive layer 41. If dust adheres to the adhesive layer 41 during the process of equalizing the thickness of the adhesive layer 41, the parallelism of the lower pole piece 21 with respect to the polished surface 43 is reduced however high the degree of flatness the polished surface 43 has. In such a case, the surface of the lower pole piece 21 must be ground or polished, after being glued in position, to improve the parallelism.

Instead of gluing a plate that serves as the lower pole piece 21 onto the supporting block 23, a thin film formed from a material of high magnetic permeability may be deposited on the supporting block 23. Sputter deposition used in the manufacture of magnetic heads is suitable as a method of deposition. In this case, formation of an adhesive layer 41 is not necessary.

In a sputtering chamber having a relatively high degree of vacuum, atoms sputtered from a target reach the supporting block 23 on which the atoms are deposited. This method allows formation of a lower pole piece 21 having an excellent flatness without affecting the flatness of the polished surface of the supporting block 23.

In the sputter deposition method, since the supporting block 23 heats up at the time of deposition, it is desirable that the supporting block 23 have a thermal expansion coefficient close to that of the lower pole piece 21. However, if an adhesive layer 41 is provided between the lower pole piece 21 and the supporting block 23, such a layer serves to absorb strain being caused by the difference in the thermal expansion coefficient between the lower pole piece 21 and the supporting block 23.

Materials suitable for the supporting block 23 for which lightness is desired include quartz, alumina, aluminum alloy, copper, aluminum, etc. Materials suitable for the lower pole piece 21 for which excellent magnetic properties are desired include soft iron, permalloy, supermalloy, sendust, metal-metalmetalloid type amorphous alloy, and metal-metal type amorphous alloy.

Figure 5:
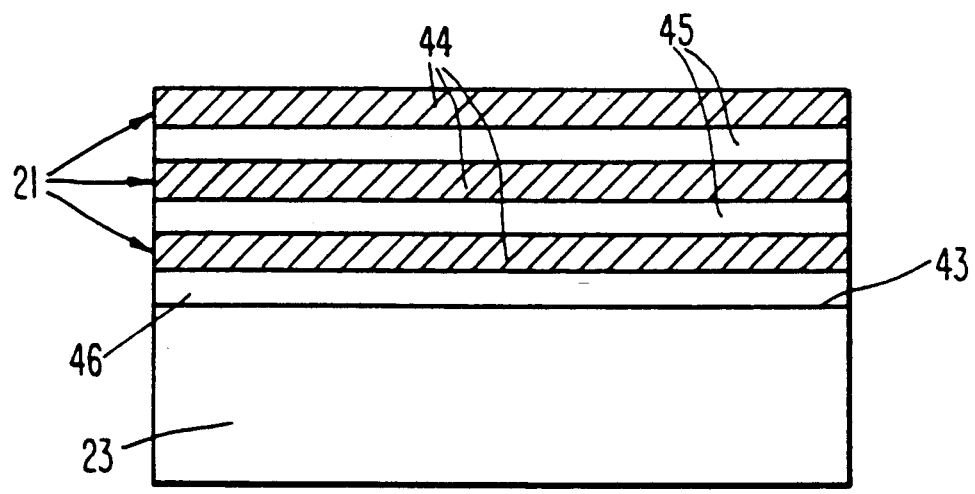
FIG. 5 is a cross sectional view of another lower pole piece.

FIG. 5 shows a cross section of another lower pole piece 21. This lower pole piece 21 includes a supporting block 23 of aluminum alloy (thickness about 7 mm) and a multi-film layer comprising nonmagnetic films 45 and high-permeability magnetic films 44 formed on top of the supporting block 23. The top surface of the supporting block 23 is treated by grinding or polishing so that a flatness of $\pm 2$ $\mu$m is provided.

On the supporting block 23, a non-magnetic film (thickness: 100 $\mu$m, thermal expansion coefficient: $65 \times 10^{-7}/°C$.) made of alumina is formed as a buffer film 46. On the alumina buffer film 46, there is formed a multi-film layer comprising high-permeability magnetic films (thickness 80 $\mu$m, thermal expansion coefficient: $120 \times 10^{-7}/°C$.) made of a metal-metal type amorphous alloy (CoNbTaZr) and non-magnetic films 45 (thickness: 3 $\mu$m, thermal expansion coefficient: $10 \times 10^{-7}/°C$.) made of quartz. The multi-film layer can be formed easily and at low cost using sputter deposition.

The thermal expansion coefficient of an aluminum alloy such as duralumin is 23° to $78 \times 10^{-7}/°C$. over the temperature range of 0° to 300° C. Strain caused by the difference in the thermal expansion coefficient between the supporting block 23 of aluminum alloy and the high-permeability magnetic films 44 is reduced by the presence of the non-magnetic films 45 and the non-magnetic buffer film 46.

Thus, the lower pole piece 21 of this embodiment consisting of a multi-film layer comprising the non-magnetic films 45 and the high-permeability magnetic films 44 has the characteristics of easy magnetization (i.e., small demagnetization coefficient) and high permeability because of its increased apparent thickness. Also, since light-weight non-magnetic films 45 are included, the lower pole piece 21 is light in weight for its apparent thickness.

When quartz (thermal expansion coefficient: $10 \times 10^{-7}/°C$.) is used as the material for the supporting block 23, and metal-metal type amorphous alloy (CoNbTaZr) as the material for the high-permeability magnetic films 44, such materials as copper (thermal expansion coefficient: $168 \times 10^{-7}/°C$.), Nichrome (thermal expansion coefficient; $130 \times 10^{-7}/°C$.) should preferably be used as the material for the non-magnetic films provided to ease thermal strain.

Also, when an aluminum alloy having a high thermal expansion coefficient ($170 \times 10^{-7}/°C$.) is used as the material for the supporting block 23, such materials as alumina (thermal expansion coefficient: $67 \times 10^{-7}/°C$.), quartz (thermal expansion coefficient; $10 \times 10^{-7}/°C$.) should preferably be used as the material for the non-magnetic films provided to ease thermal strain.

With the lower pole piece 21 thus having the non-magnetic films 45 interposed between the highpermeability magnetic films 44 to ease thermal strain, the magnetic properties can be prevented from deteriorating due to the strain caused by the difference in the thermal expansion coefficient.

To further improve the magnetic properties of the lower pole piece 21, it is necessary to make the lower pole piece 21 from a magnetic material having a magnetostriction coefficient $\lambda$ close to zero.

Such a magnetic material can be obtained, for example, by adding Zr having a positive magnetostriction coefficient to a CoNbTa type material having a negative magnetostriction coefficient $\lambda$. The result is CoNbTaZr having a magnetostriction coefficient smaller than $10^{-5}$. When the ratio of Nbta to Zr is about 2 to 3.1, the magnetostriction coefficient $\lambda$ becomes further close to zero.

Materials suitable for the high-permeability magnetic films 44 include soft iron, permalloy, Supermalloy, Sendust, metal-metal-metalloid type amorphous alloy, and metal-metal amorphous alloy. Materials suitable for the non-magnetic films 45 and 46 include alumina, quartz, etc.

Figure 6:
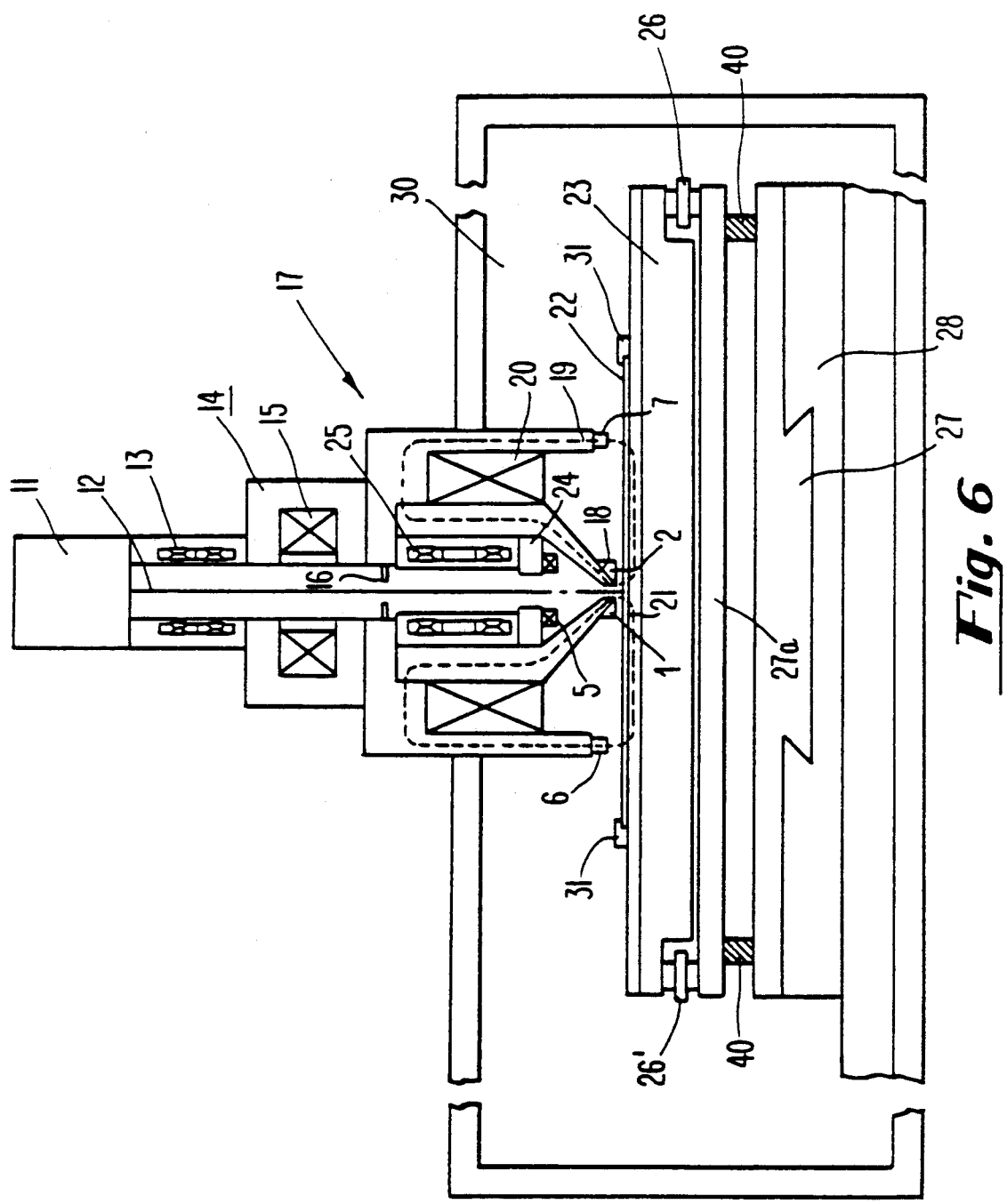
FIG. 6 is a cross sectional view showing in a schematic form the construction of an SEM in a second embodiment of the present invention.

FIG. 6 shows a schematic diagram of an SEM in a second embodiment of the present invention. The SEM of this embodiment includes an astigmatism correction coil 5, magnetic field sensors 1-4 and 6-9 and a stage height control mechanism 40, so that the astigmatism which increases with the lateral movement of the lower pole piece 21 is automatically corrected.

The SEM of this embodiment includes a memory and a CPU. The memory is used to store combinations of current and voltage values at which astigmatism correction is achieved in an initial adjustment mode, as described hereinafter, by adjusting current to be supplied to the objective lens coil 20, current to be supplied to the astigmatism correction coil 5, and voltage to be supplied to stage height control mechanism 40 according to various positions of the stage.

The CPU works to control a current to the objective lens coil 25 and a current for the astigmatism correction coil 5 and a voltage to the stage height control mechanism 40, the currents and voltage being selected according to the position of the stage from the current and voltage values stored in the memory with respect to the various positions of the stage.

Figure 7A:
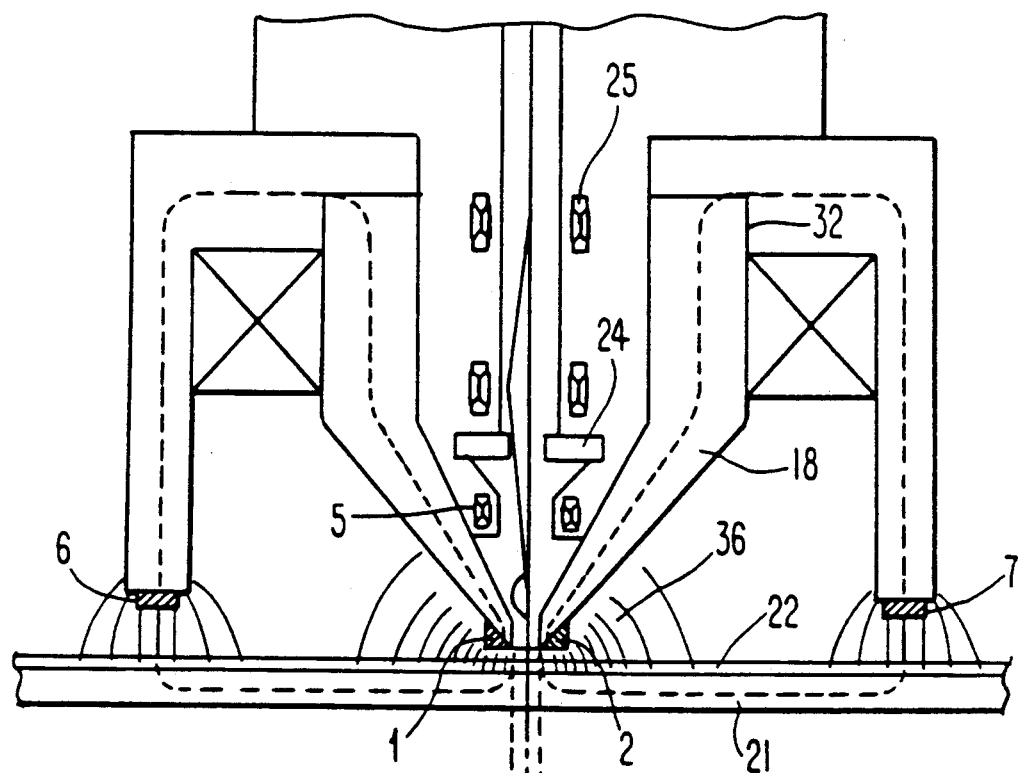
FIG. 7A is a cross sectional view of the objective lens of the second embodiment of the invention.

FIG. 7A shows a fairly detail cross section of the objective lens 17 of this embodiment. The astigmatism correction coil 5 is provided to create a magnetic field to correct the astigmatism caused by the objective lens 17, and is disposed above the hole provided in the upper pole piece 18. Therefore, the electron beam 12 enters the magnetic field of the objective lens 17 after passing through the magnetic field created by the astigmatism correction coil 5.

The astigmatism correction coil 5 of this embodiment is an air-core coil having eight poles which are arranged so that an N pole faces an N pole and an S pole faces an S pole. By adjusting the current flowing through the astigmatism correction coil 5, astigmatism can be reduced.

Figure 7B:
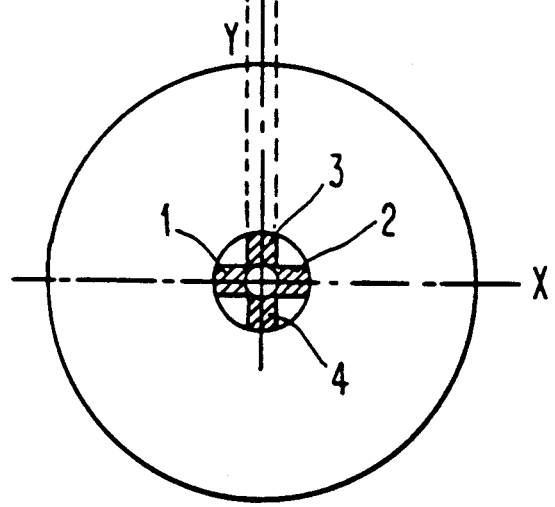
FIG. 7B is a plan view showing the arrangement of magnetic field sensors provided on the objective lens.

Magnetic field sensors 1-4 are provided to measure the strength of the axial magnetic field formed between the hole portion of the upper pole piece 18 and the surface of the lower pole piece 21. As shown in FIGS. 7A and 7B, the magnetic field sensors 1-4 are disposed adjacent to the hole of the upper pole piece 18. The magnetic field sensors 1 and 2 are disposed on the X-axis of FIG. 7B, and the magnetic sensors 3 and 4 on the Y-axis thereof.

Magnetic field sensors 6-9 are provided to measure the strength of the axial magnetic field formed between the outer lower end 19 of the magnetic path 10 and the surface of the lower pole piece 21. The magnetic field sensors 6-9 are provided on the outer lower end 19 of the magnetic path 10. Like the magnetic sensors 1 and 2, the magnetic sensors 6 and 7 are disposed on the X-axis (but not shown in FIG. 7B). Also, magnetic sensors 8 and 9 are disposed on the Y-axis on the outer lower end 19 of the magnetic path 10. Hall elements are suitably used as these magnetic sensors 1-4 and 6-9.

Figure 8A:
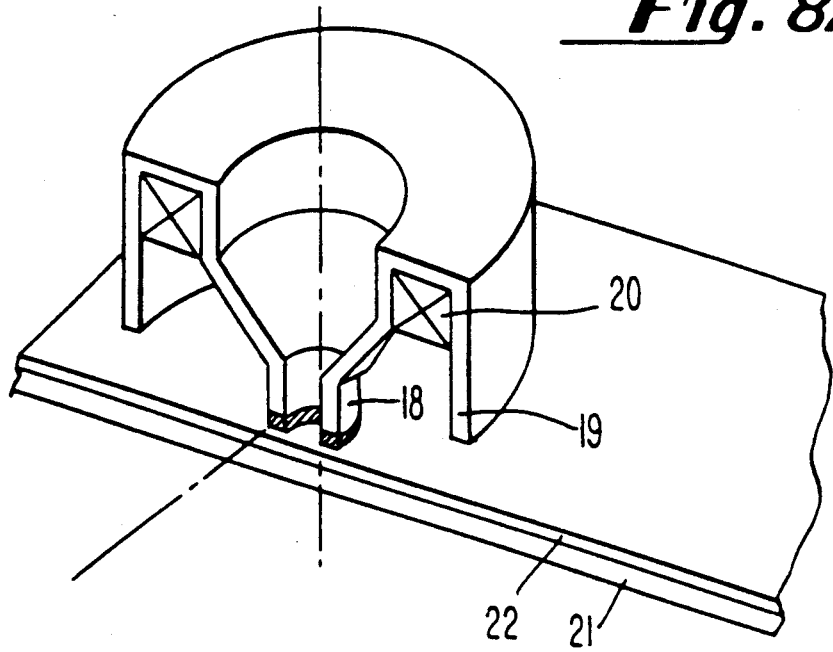
FIG. 8A is a perspective view of the objective lens.
Figure 8B:
FIG. 8B is a diagrammatic plan view of Hall elements provided in the objective lens.
Figure 8B:
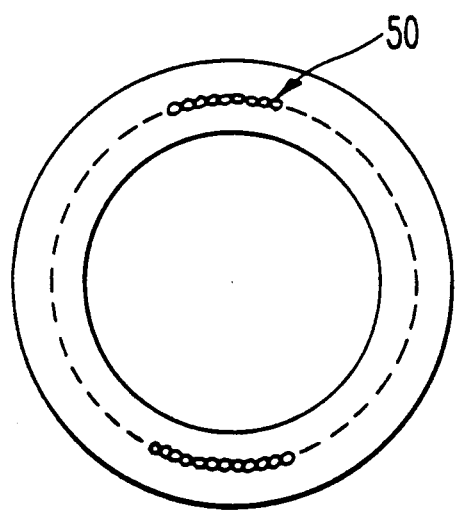

FIG. 8A is a perspective view showing a cross section of the objective lens 17 of this embodiment. FIG. 8B is a diagrammatic view showing Hall elements forming the magnetic field sensors 1-4. As shown in FIG. 8B, a plurality of Hall elements (for example, 256 pieces) 50 are provided around the hole in the upper pole piece 18, at least one Hall element forming one magnetic field sensor.

Since these Hall elements 50 are formed using a semiconductor integrated circuit technique, magnetic field sensors having a uniform magnetic field detection characteristic can be easily made. Using these Hall elements 50, it is also possible to make magnetic field sensors to detect magnetic fields not only in the axial direction but also in the lateral direction.

Referring back to FIG. 6, we will now explain the stage height control mechanism 40. The stage height control mechanism 40 is provided at four places between a moving block 27a and a moving block 27. The three-dimensional positional relationship between the moving block 27a and the moving block 27 is adjusted by adjusting the distance between the moving block 27a and the moving block 27 at each place. The stage height control mechanism is controlled electrically using stage height control motors. In this specification, the term stage refers to the supporting block 23.

Figure 9:
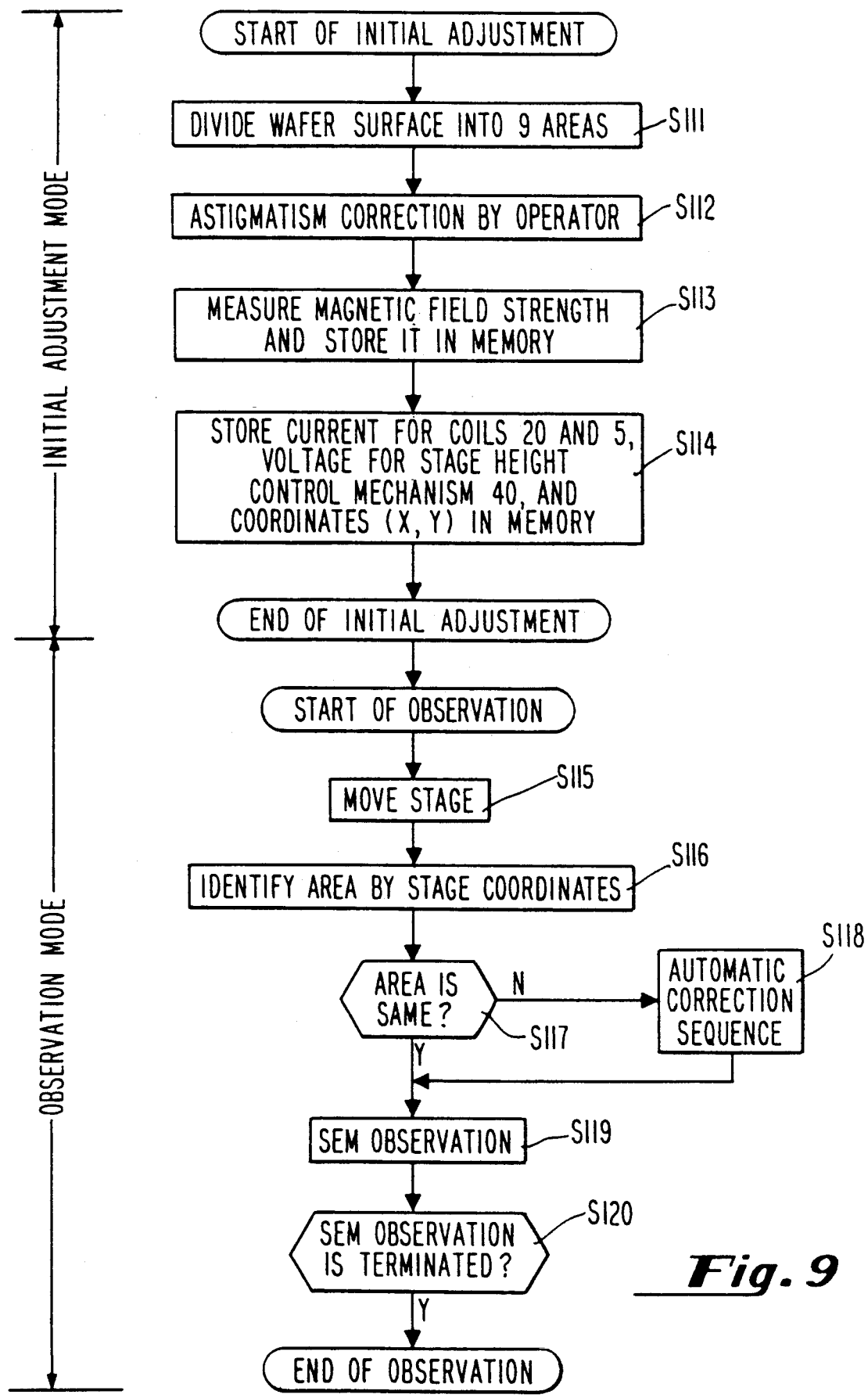
FIG. 9 is a flowchart showing a sequence for astigmatism reduction operation in the SEM of the second embodiment of the invention.

Referring to the flowchart of FIG. 9, we will now explain how the operation for astigmatism correction is performed in the SEM of this embodiment.

First, in step 111, the main surface of the wafer 22 to be observed is divided into nine observation areas arrayed in a 3×3 matrix form. Each area is specified and identified by a set of position coordinates of the stage. In this embodiment, the number of areas is nine, but the areas can be set in any desired number. Also, the areas may be determined so as to correspond to respective chip areas on the wafer 22. In step 112, astigmatism correction is made by the operator while projecting the electron beam 12 on the center of each area. The astigmatism correction work is performed by adjusting the current to be supplied to the coil 20 and the current to be supplied to the astigmatism correction coil 5 as well as the voltage to be supplied to the stage height control mechanism 40.

The magnetic field strength (initial state magnetic field information) under which the astigmatism correction has been done with respect to the center of each area is measured by the magnetic field sensors, and the thus measured value for each area is stored in the memory in step 113. In step 114, the values of the current flowing through the coil 20 and the current flowing through the astigmatism correction coil 5, the value of the voltage applied to the stage height control mechanism 40, and the position coordinates of the stage at the time of completion of the astigmatism correction are stored in the memory with respect to each area. With the above procedure, the initial adjustment is completed.

In step 115, the stage is moved by the operator in the lateral direction so that the desired portion on the surface of the wafer 22 can be observed (so that the electron beam 12 is projected onto the portion to be observed). In step 116, after moving the stage, the area on which the electron beam 12 is projected is identified by the position coordinates of the stage. In step 117, on the basis of the position coordinates of the stage, it is determined whether the area on which the electron beam 12 is currently projected is the same area as before the stage was moved. If the current area is the same area as before the stage was moved (in the case of Y), the process moves to step 119 to proceed with observation. In step 120, the observation is terminated.

Figure 10:
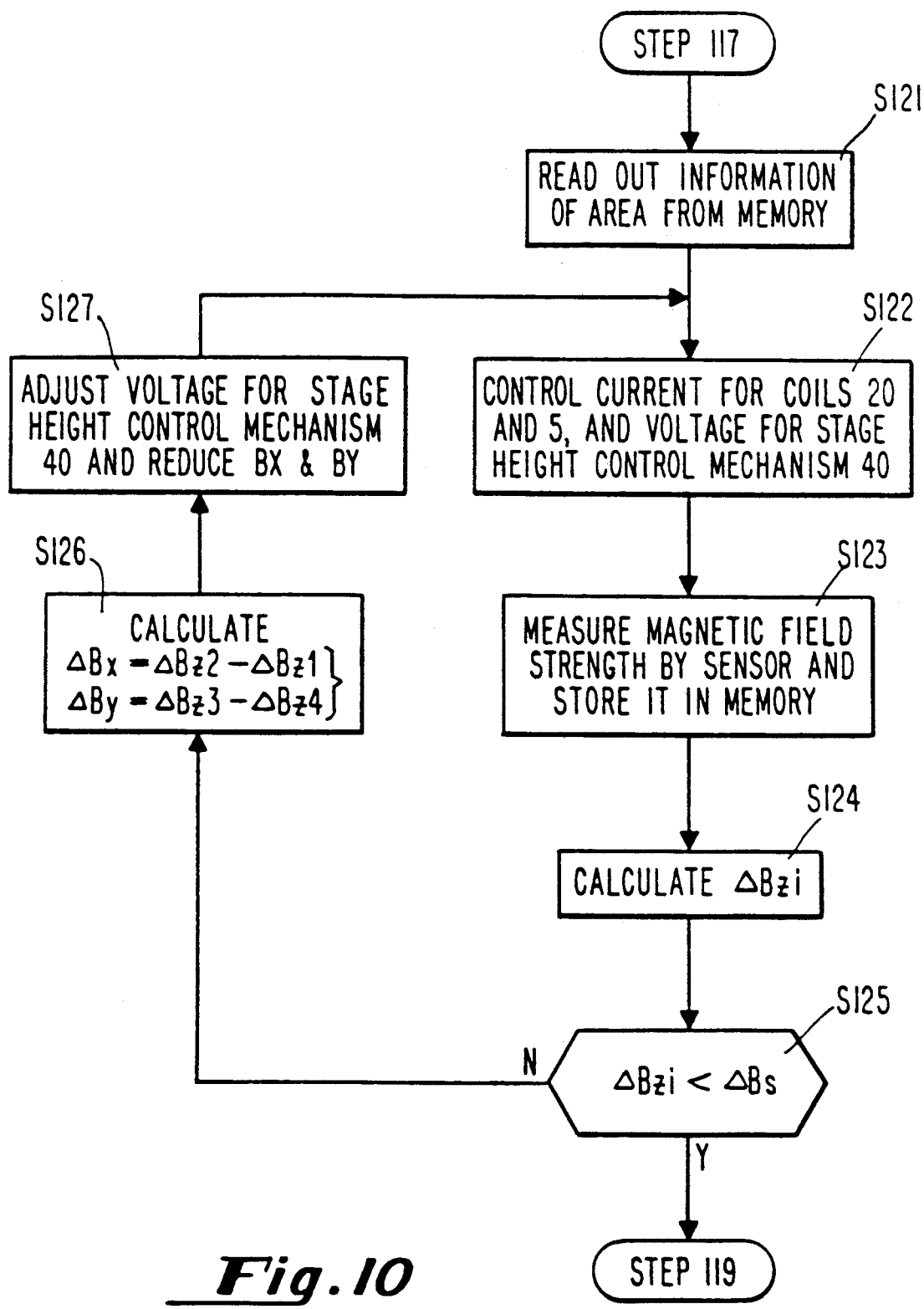
FIG. 10 is a flowchart showing in detail a sequence for magnetic field reproduction in the sequence of FIG. 9.

In step 117, if the current area is different from that before the stage was moved (in the case of N), the process moves to step 118 in which a current is supplied to the astigmatism correction coil 5 and the coil 20, and a voltage to the stage height control mechanism 40, the current and voltage being based on the combination of values stored in the memory with respect to the current area. We will explain this sequence with reference to FIG. 10.

In step 121, the information stored for the current area is read out of the memory. In step 122, based on the values read from the memory such as the current flowing through the coil 20 and the current flowing through the astigmatism correction coil 5 and the voltage applied to the stage height control mechanism 40, current and voltage are supplied to the respective parts. In step 123, magnetic field information is detected by means of the magnetic field sensors 1, 2, 3, and 4, and the thus detected magnetic field information is stored in the memory. In step 124, the initial state magnetic field information $BO_i$ ($i = 1, 2, 3, 4$) and the latest magnetic field information $Bz_i$ are compared to compute the deviation $\Delta Bz_i$ which is given by:

$$\Delta Bz_i = Bz_i - BO_i$$

In step 125, it is determined whether $Bz < Bs$ (specified value). When the difference between the initial state magnetic field information and the current magnetic field information is smaller than the specified value Bs (in the case of Y), it is determined that astigmatism has been successfully corrected, and the process moves to step 119 in FIG. 9. Conversely, when the difference between the initial state magnetic field information and the current magnetic information is greater than the specified value Bs (in the case of N), it is determined that astigmatism has not been sufficiently corrected, and the process moves to steps 126 and 127. In step 126, the following calculations are made.

$\Delta Bx = \Delta Bz1 - \Delta Bz2$ $\Delta By = \Delta Bz3 - \Delta Bz4$ $\Delta Bx$ is obtained from the magnetic field sensors 1 and 2, and represents the degree of the magnetic field distortion (asymmetry) in the X direction. $\Delta By$ is obtained from the magnetic field sensors 3 and 4, and represents the degree of the magnetic field distortion in the Y direction.

In step 127, the height and inclination of the stage are adjusted by means of the stage height control mechanism 40 in such a way as to reduce $\Delta Bx$ and $\Delta By$. In step 120 of FIG. 9, it is determined whether to terminate the observation of the SEM image. When the observation is to be terminated (in the case of Y), the observation terminates, and when the observation is not to be terminated (in the case of N), the process returns to step 122 to repeat the above sequence.

Thus, in the SEM of this embodiment, any astigmatism increase as a result of a relatively longrange lateral movement of the stage is automatically corrected on the basis of the values previously stored in the memory for each area with regard to the current to be supplied to the astigmatism correction coil 5 and the coil 20 and the voltage to be supplied to the stage height control motors.

Figure 11:
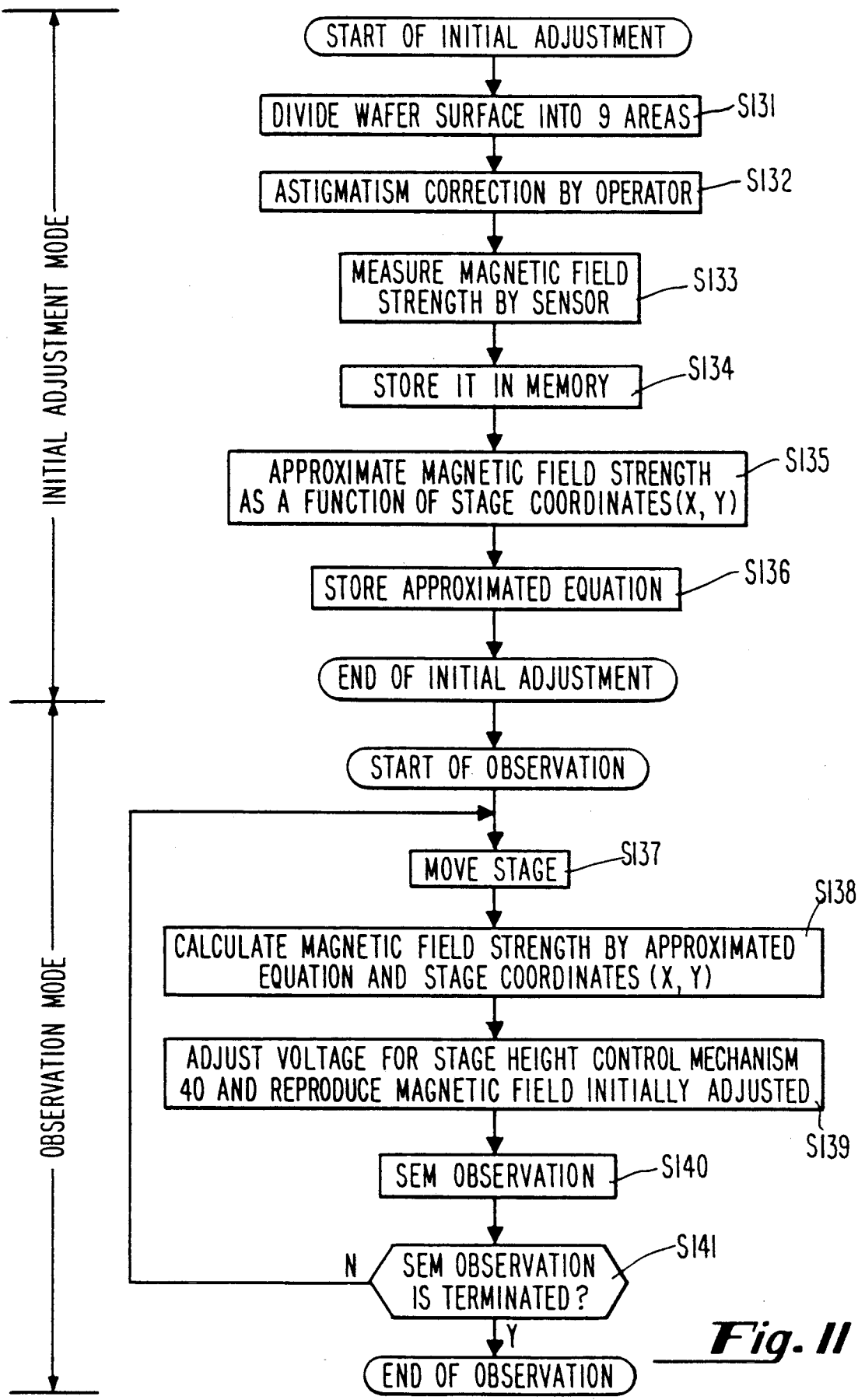
FIG. 11 is a flowchart showing another sequence for the astigmatism reduction operation.

Correction is also made using the magnetic field sensors to ensure reduction of astigmatism. Referring now to the flowchart of FIG. 11, another example of astigmatism correction operation is explained. First, in step 131, the main surface of the wafer 22 to be observed is divided into nine observation areas arrayed in a 3×3 matrix form. Each area is identified by the position coordinates of the stage.

In step 132, astigmatism correction is made by the operator with respect to the center of each area. In step 133, the magnetic field strength under which astigmatism correction has been done with respect to the center of each area is measured by the magnetic field sensors, and, in step 134, the thus measured value is stored in the memory with respect to each area. In step 135, the magnetic field strengths are approximated as functions of position coordinates of the stage as shown in the following equations.

$Bzi = fi (x, y) (i = 1, 2)$ $Bzj = fj (x, y) (j = 3, 4)$ where $Bzi$ and $Bzj$ represent the magnetic field strengths measured by the magnetic sensors 1 and 2 and the magnetic sensors 3 and 4, respectively, and (x, y) indicates the position coordinates of the stage.

In step 136, the above equations are stored in the memory, completing the initial adjustment. In step 137, the stage is moved by the operator so that the desired portion on the wafer 22 can be observed. In step 138, the area to be observed is identified by the position coordinates of the stage. The magnetic field strength for the position coordinates is calculated using the equations stored in the memory. In step 139, the voltage to be applied to the stage height control motors is adjusted so that the magnetic field strength to be measured becomes equal to the calculated magnetic field strength for the current stage position. In this way, the magnetic field under which the astigmatism is corrected by operation in the initial adjustment is automatically reproduced. In step 140, observation is performed. In step 141, it is determined whether to terminate the observation. When the observation is to be terminated (in the case of Y), the observation terminates, and when the observation is not to be terminated (in the case of N), the process returns to step 137 to repeat the above sequence.

According to the above procedure for astigmatism correction, the height and inclination of the stage are adjusted for any stage position so that the magnetic field strength calculated using the equations stored in the memory can be obtained for that stage position, thereby automatically correcting astigmatism.

Figure 12:
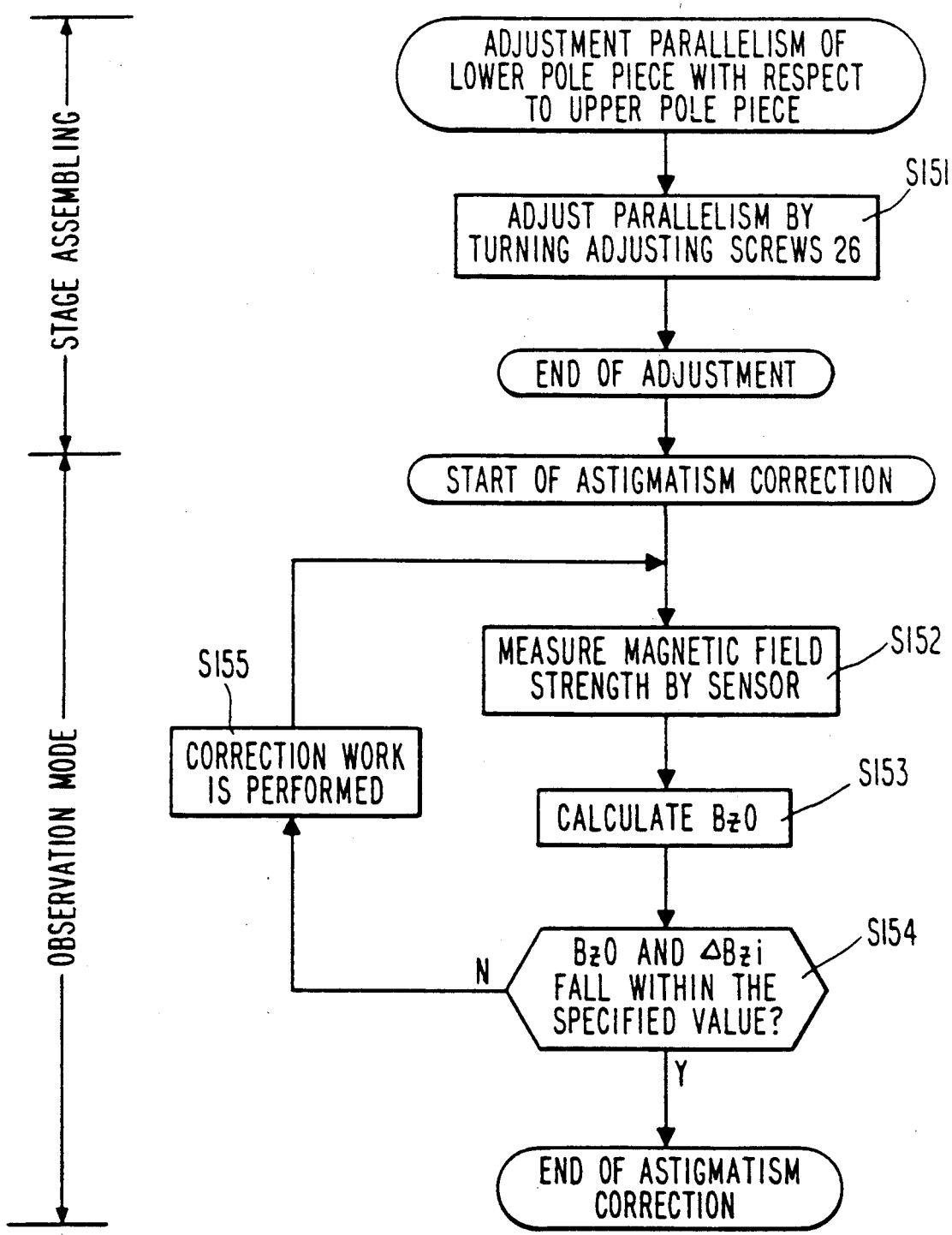
FIG. 12 is a flowchart showing still another sequence for the astigmatism reduction operation.

The above method of astigmatism correction is effective particularly when the astigmatism cannot be sufficiently reduced even if the magnetic field is formed symmetrically with respect to the axis. However, in cases where the astigmatism can be sufficiently reduced by forming axially symmetrical magnetic fields, the following method is simpler and therefore, more practical. This method of astigmatism reduction is explained in the following with reference to the flowchart of FIG. 12.

First, in step 151, at the time of assembling the stage in position, the parallelism of the lower pole piece mounted on the supporting block 23 is adjusted with respect to the upper pole piece 18 by turning the adjusting screws 26. With the above adjustment, astigmatism is reduced to a minimum.

In step 152, when the object is being observed by the SEM, magnetic field strengths are measured using the magnetic field sensors. After the stage is moved so that the electron beam 12 is projected onto a desired observation portion on the wafer 22, the magnetic field strengths $Bzi$ ($i = 1, 2, 3, 4$) are measured using the magnetic field sensors 1, 2, 3, 4. In step 153, the deviation $\Delta Bzi$ of each magnetic field strength $Bzi$ from its corresponding axially symmetric component $BzO$ is calculated as follows:

$$BzO = \frac{1}{4} \sum_{i=1}^{4} (Bzi) \quad (i = 1, 2, 3, 4)$$

$$\Delta Bzi = Bz - BzO \quad (i = 1, 2, 3, 4)$$

In step 154, it is determined whether $BzO$ and $\Delta Bzi$ fall within the specified value. If within the specified value (in the case of Y), the astigmatism correction work is terminated. If not within the specified value (in the case of N), correction is made, in step 155, using the stage height control mechanism, after which the process proceeds to step 152.

Thus, when the object is being observed by the SEM, correction work is automatically performed by means of the stage height control mechanism 40 so that BzO and $\Delta$Bzi are brought within the range of the specified value, thereby forming an axially symmetric magnetic field having a uniform magnitude between the upper pole piece 18 and the lower pole piece 21. Astigmatism is thus reduced.

If the parallelism of the lower pole piece 21 is not properly adjusted with respect to the upper pole piece 18, astigmatism will increase substantially as the stage is moved in the lateral direction. In that case, it is not possible to quickly correct the astigmatism by the above method of astigmatism correction alone.

Figure 13A:
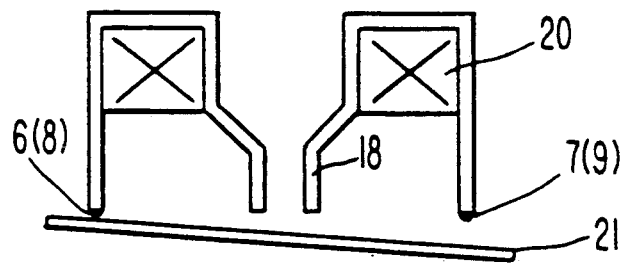
FIG. 13A and FIG. 13B are diagrammatic cross sectional views showing pole pieces before and after correction of parallelism, respectively.
Figure 13B:
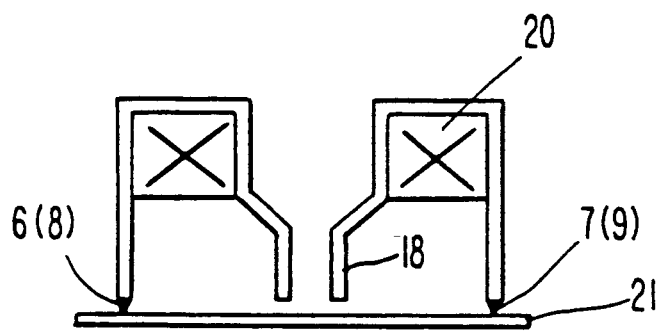

FIG. 13A shows an example of the objective lens whose parallelism is not adjusted properly. In this example, the lower pole piece 21 is slanting upward to the right. Bz6, Bz7, Bz8, and Bz9 denote the magnetic field strengths measured by the magnetic field sensors 6, 7, 8, and 9, respectively. In the condition shown in FIG. 13A, the relationship is given, for example, by $Bz6 > Bz7$, $BzO = Bz8 = Bz9$. On the other hand, shown in FIG. 13B is a pole piece whose parallelism is properly adjusted. In this condition, the relationship $Bz6 = Bz7 = Bz8 = Bz9$ can be obtained. Once a high degree of parallelism is achieved as shown in FIG. 13B by performing parallelism adjustment work between steps 151 and 152 of FIG. 12, it is possible to quickly reduce the astigmatism.

In the prior art, observation of a cross sectional profile of uneven patterns in the surface of a specimen has been accomplished by cutting the specimen and scanning the cutting face of the specimen by the electron beam. In contrast, the SEM of the present invention is characterized by a small depth of focus and, hence, a great ratio of the intensity of a secondary electron signal obtained when out of focus to that of a secondary electron signal obtained when in focus. Utilizing this characteristic, information on the cross sectional profile of uneven patterns in the surface of the specimen can be obtained by scanning the surface of the specimen by the electron beam. Using this information, the cross sectional profile can be produced on the display.

Figure 16:
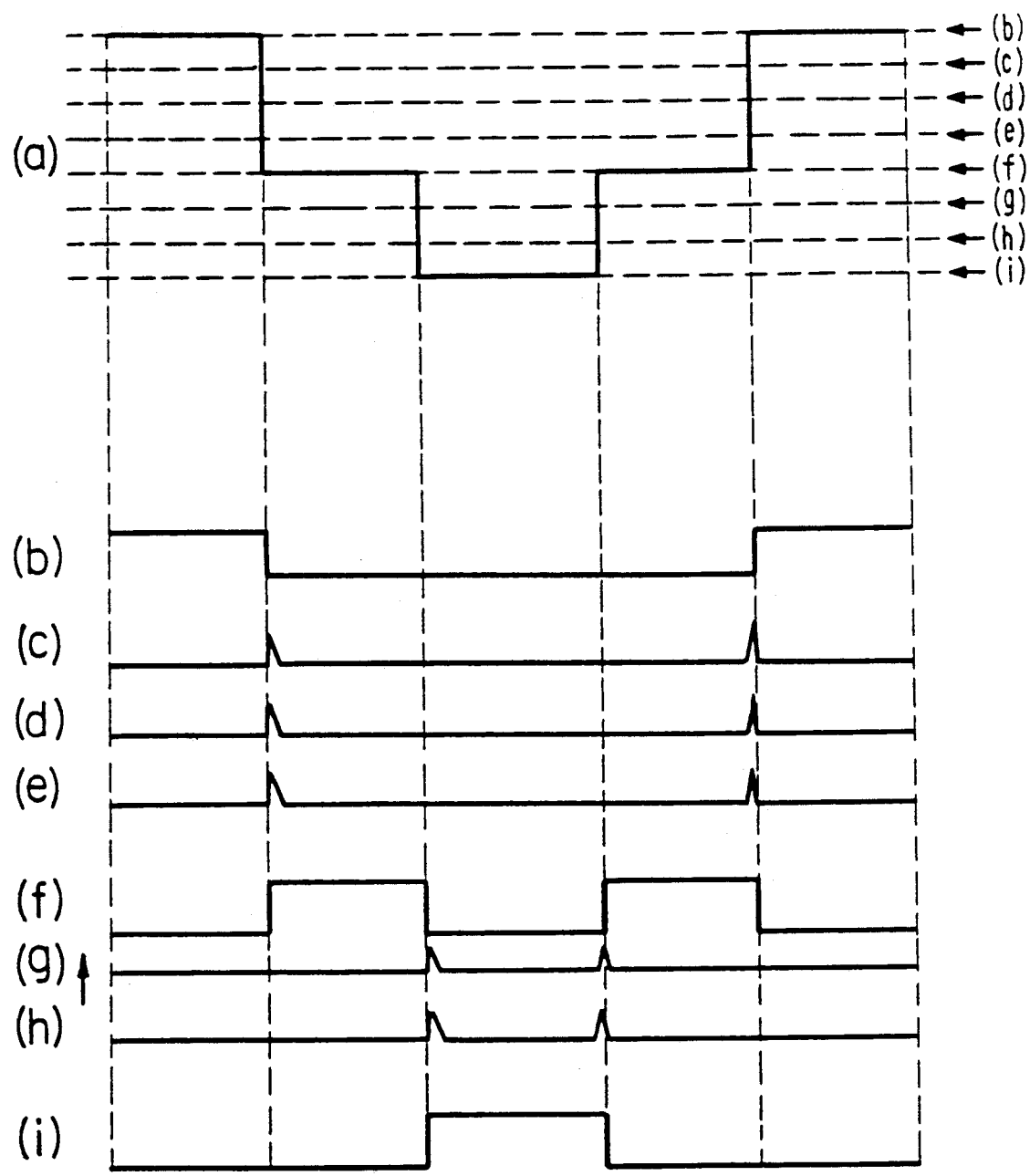
FIG. 16 is a schematic diagram showing a cross sectional profile and secondary electron signals.

In the following, we will describe the principle of a method of displaying cross sectional profiles of uneven patterns in the surface of a specimen using the SEM of the second embodiment. To simplify the matter, the description deals with a case in which the electron beam scans an uneven surface pattern of a specimen having a cross sectional profile as shown in FIG. 16(a). The reference characters (b) to (i) in FIG. 16 represent secondary electron signals obtained in correspondence to respective focal lengths when the focal length of the electron beam is increased stepwise.

Generally, a second electron signal of a high intensity level is obtained from an observation point on the specimen surface on which the electron beam is focused. In other words, it can be considered that a point in a secondary electron signal exceeding a certain level (threshold) represents a point on the specimen on which the electron beam is focused. Since the focal length of the electron beam varies with the current flowing in the objective lens coil 20, if the relationship between the focal length and the current in the coil 20 is known, the focal length can be known by the current, and from the focal length, the relative height of the point in focus on the specimen can be obtained.

Using the secondary electron signals indicated by (b) to (i) in FIG. 16, the position on the specimen surface is determined in relation to the focal length when the corresponding secondary electron signal exceeds the threshold level. Using this information, a cross sectional profile such as shown in FIG. 16(a) is produced.

Thus, according to the method of displaying cross sectional profiles in this embodiment, a cross sectional profile of a specimen can be produced on a display without cutting the specimen and scanning the cutting face thereof by the electron beam.

Figure 14:
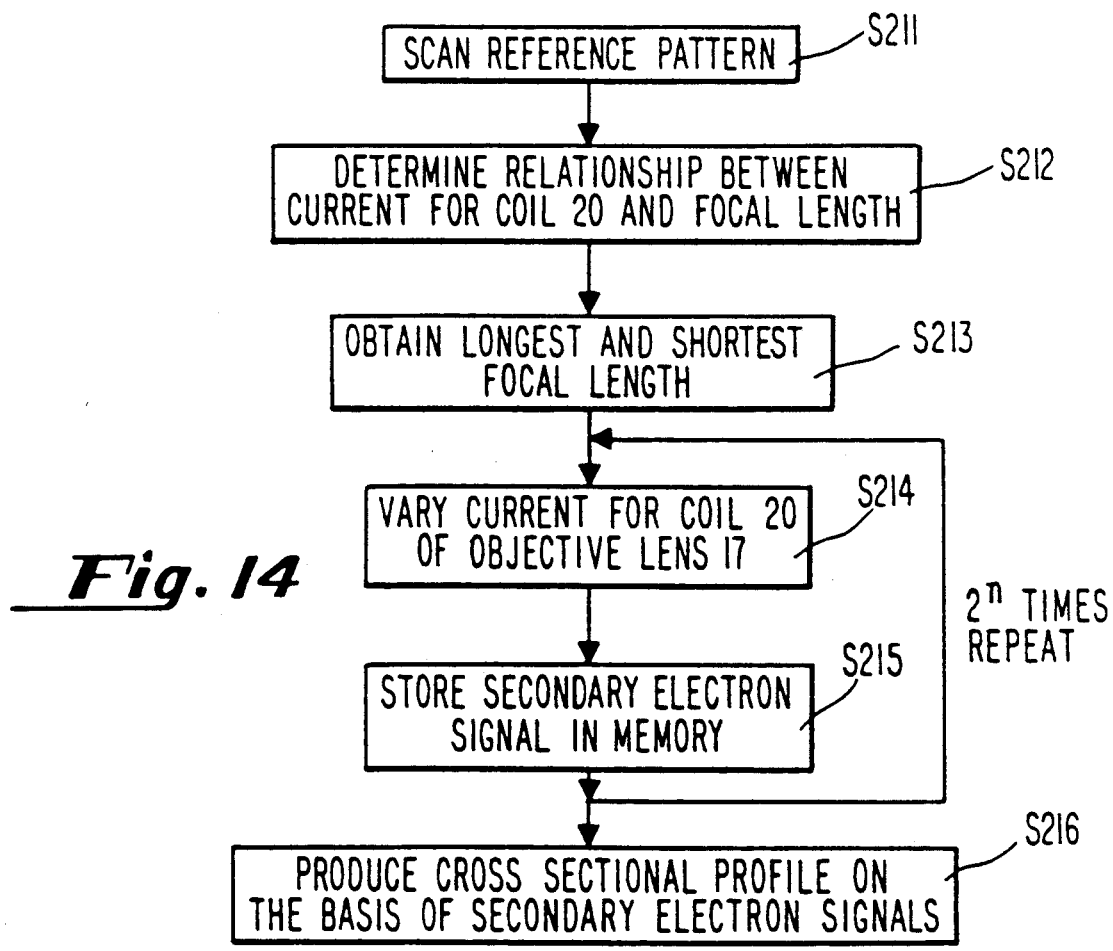
FIG. 14 is a flowchart showing a sequence and a method for displaying a cross sectional profile of a specimen using the SEM of the present invention.

With reference to the flowchart of FIG. 14, we will now describe a procedure for displaying a cross sectional profile according to the method of this embodiment. First, in step 211, a reference pattern formed on the wafer surface and having portions of different heights is scanned by the electron beam. The reference pattern has an uneven structure with a known cross sectional profile. In step 212, the relationship of the magnitude of the current to flow in the coil 20 of the objective lens 17 is determined with respect to the focal length. To describe specifically, the predicted relationship between the current in the coil 20 and the focal length is corrected on the basis of the current that actually flows in the coil 20 when the focus is brought to each of various observation points on the reference pattern.

By thus adjusting the magnitude of the current that actually flows in the coil 20, a desired focal length can be obtained. In step 213, the longest and shortest focal lengths applicable for the observation are obtained by scanning the wafer surface by the electron beam and observing the thus produced SEM image. To describe specifically, the deepest contact hole formed in the wafer is scanned by the electron beam to obtain the longest focal length by focusing on the bottom of the contact hole and the shortest focal length by focusing on a portion on the wafer where no contact holes are formed. In step 214, first the current corresponding to the shortest focal length is supplied to the coil. Thereafter, the current is incrementally varied (for example, in eight steps) to increase the focal length until the longest focal length is reached. In step 215, the resulting secondary electron signal is converted, by means of an A/D converter, into a digital signal, which is then stored in the memory as focus information. Steps 214 and 215 are repeated by $2^n$ times (where n is a natural number). In step 216, a cross sectional profile produced on the basis of the $2^n$ secondary electron signals is displayed on the display.

Figure 15:
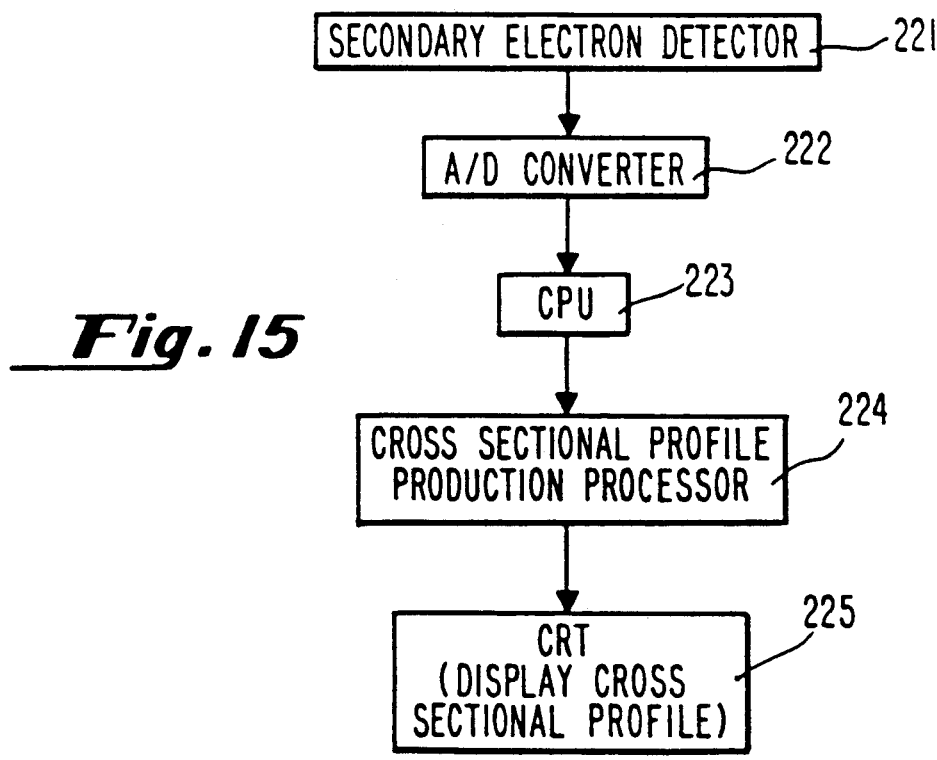
FIG. 15 is a schematic diagram showing the flow of secondary electron signals when displaying a cross sectional profile.

FIG. 15 is a schematic diagram showing the flow of the secondary electron signals in the above embodiment. First, the secondary electrons emitted from the specimen are detected by the secondary electron detector 221. The secondary electron detector 221 outputs an analog signal (secondary electron signal) corresponding to the volume of the detected secondary electrons, to an A/D converter 222. The A/D converter 222 converts the analog signal into an digital signal to transfer to a CPU 223. The CPU 223 relates the digitized secondary electron signal to the focal length obtained from the value of the current that flows in the objective lens coil 20, and stores the thus related information in its memory. The stored digital signal is read out and transferred to a cross sectional profile reproduction processor 224. The cross sectional profile reproduction processor 224 processes the digital signals to reproduce a cross sectional profile. The produced cross sectional profile is then transferred to a CRT 225. The CRT 225 displays the reproduced cross sectional profile.

The method of displaying cross sectional profiles according to this embodiment enables a cross sectional profile to be obtained without cutting a specimen, and is therefore suitable, among others, for observation of wafers during the semiconductor manufacturing process. According to this method, detailed information on cross sectional profiles of contact holes, wiring, etc. of semiconductor integrated circuits can be obtained with ease.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A scanning electron microscope comprising:
    an electron gun for emitting an electron beam;
    an objective lens for forming a magnetic field in a path through which the electron beam passes; and
    a secondary electron detector for detecting secondary electrons produced by the impingement of the electron beam on a specimen, wherein:
    said objective lens includes a first pole piece and a second pole piece;
    said first pole piece is provided with a hole through which the electron beam passes, and is disposed between said electron gun and said second pole piece; and
    said second pole piece has a planar portion on which the specimen is placed, and said second pole piece being mounted on a supporting block movable in a plane substantially perpendicular to the projecting direction of the electron beam.

2. A scanning electron microscope according to claim 1, wherein said second pole piece is formed from a plate of a material having high magnetic permeability, and said supporting block is formed from a non-magnetic material.

3. A scanning electron microscope according to claim 1, wherein said second pole piece consists of a multi-film layer comprising a high-magnetic-permeability film and a non-magnetic film, and said supporting block is formed from a non-magnetic substance.

4. A scanning electron microscope according to claim 1, further comprising:
    astigmatism correction means for correcting astigmatism of the objective lens by adjusting magnetic field formed in the electron beam path according to an electric amount supplied to said astigmatism correction means;
    memory means for storing values of the electric amount to the astigmatism correction means when astigmatism corrections at a plurality of selected positions of said specimen are achieved in an initial adjustment mode, said values of the electric amount corresponding respectively to the positions of the specimen at which said astigmatism corrections are achieved; and
    control means for controlling the electric amount to be supplied to the astigmatism correction means to be equal to the value of the electric amount which is read out from said memory means according to a position of the specimen to be observed in an observation mode.

5. A scanning electron microscope according to claim 4, wherein said astigmatism correction means comprises:
    astigmatism correction coils for reducing astigmatism of the objective lens by adjusting the magnetic field formed in the electron beam path according to a current to be supplied; and
    height control means for adjusting the height of the said supporting block according to a voltage to be supplied.

6. A scanning electron microscope according to claim 1, further comprising:
    astigmatism correction means for correcting astigmatism of the objective lens by adjusting magnetic field formed in the electron beam path according to an electric amount supplied to said astigmatism correction means;
    magnetic field sensor means for measuring a strength of a magnetic field formed between said first pole piece and said second pole piece;
    memory means for storing values of the electric amount to be supplied to the astigmatism correction means and magnetic field strengths measured by said magnetic field sensor means when astigmatism corrections at a plurality of selected positions of said specimen are achieved in an initial adjustment mode, said values of the electric amount and the magnetic field strengths corresponding respectively to the positions of the specimen at which the astigmatism corrections are achieved; and
    control means for controlling the electric amount to be supplied to the astigmatism correction means to be equal to the value of the electric amount which is read out from said memory means according to a position of the specimen to be observed in an observation mode, said control means comparing a magnetic field strength measured by the magnetic filed sensor means at said position of the specimen to be observed with the magnetic field strength which is read out from said memory means according to said position of the specimen to be observed, said control means controlling the electric amount to be supplied to the astigmatism correction means so as to reduce a difference between said magnetic field strength measured by the magnetic filed sensor means and said magnetic field strength which is read out from said memory means.

7. A scanning electron microscope according to claim 6, wherein said astigmatism correction means comprises:
    astigmatism correction coils for reducing astigmatism of the objective lens by adjusting the magnetic field formed in the electron beam path according to a current to be supplied; and
    height control means for adjusting the height of the said supporting block according to a voltage to be supplied.

8. A scanning electron microscope according to claim 1, further comprising:
    astigmatism correction means for correcting astigmatism of the objective lens by adjusting magnetic field formed in the electron beam path according to an electric amount supplied to said astigmatism correction means;

magnetic field sensor means for measuring a strength of a magnetic field formed between said first pole piece and said second pole piece;

memory means for storing magnetic field strengths measured by said magnetic field sensor means when astigmatism corrections at a plurality of selected positions of said specimen are achieved in an initial adjustment mode, and storing an expression defining the relationship between said measured magnetic field strengths and the positions of the specimen at which said magnetic field strengths are obtained; and control means for controlling a magnetic field strength measured by said magnetic filed sensor means to be equal to the magnetic filed strength which is obtained from said expressions stored in said memory means according to a position of the specimen to be observed in an observation mode.

9. A scanning electron microscope according to claim 8, wherein said astigmatism correction means comprises:

astigmatism correction coils for reducing astigmatism of the objective lens by adjusting the magnetic field formed in the electron beam path according to a current to be supplied; and height control means for adjusting the height of the said supporting block according to a voltage to be supplied.

10. A method of displaying cross sectional profiles, comprising the steps of:

obtaining a plurality of secondary electron signals by scanning a surface of a specimen by electron beams while incrementally varying a focal length of the electron beams by changing a current flowing through an objective lens coil;

storing said secondary electron signals in relation to respective values of varied focal lengths; and producing a cross sectional profile of the surface of the specimen on the basis of the values of the incrementally varied focal length and the positions on a surface of the specimen at which the electron beams with focal lengths corresponding respectively to said values is focused.

* * * * *